(12) United States Patent
Van Ingen Schenau et al.

(10) Patent No.: US 7,443,486 B2
(45) Date of Patent: Oct. 28, 2008

(54) METHOD FOR PREDICTING A CRITICAL DIMENSION OF A FEATURE IMAGED BY A LITHOGRAPHIC APPARATUS

(75) Inventors: Koen Van Ingen Schenau, Veldhoven (NL); Maurice Henricus Franciscus Janssen, Eindhoven (NL); Antoine Gaston Marie Kiers, Veldhoven (NL); Hans Van Der Laan, Veldhoven (NL); Peter Clement Paul Vanoppen, Hechtel-Eksel (BE)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 11/353,235

(22) Filed: Feb. 14, 2006

(65) Prior Publication Data

US 2006/0192936 A1 Aug. 31, 2006

Related U.S. Application Data

(60) Provisional application No. 60/655,907, filed on Feb. 25, 2005.

(51) Int. Cl.
*G03B 27/72* (2006.01)
(52) U.S. Cl. .............................. 355/69; 355/77; 430/30
(58) Field of Classification Search .................. 355/53, 355/69, 67, 77; 716/19–21; 430/30
See application file for complete search history.

(56) References Cited

U.S. PATENT DOCUMENTS

| | | | |
|---|---|---|---|
| 5,703,692 A | 12/1997 | McNeil et al. ............... 356/445 |
| 5,880,838 A | 3/1999 | Marx et al. .................. 356/351 |
| 5,917,581 A | 6/1999 | Suzuki .......................... 355/55 |
| 5,963,329 A | 10/1999 | Conrad et al. ............... 356/372 |
| 6,187,488 B1 | 2/2001 | Hayasaki et al. ............... 430/30 |
| 6,215,578 B1 | 4/2001 | Lin ............................. 359/292 |
| 6,608,690 B2 | 8/2003 | Niu et al. ..................... 356/635 |
| 6,699,624 B2 | 3/2004 | Niu et al. ......................... 430/5 |
| 6,704,661 B1 | 3/2004 | Opsal et al. ................... 702/27 |
| 6,721,691 B2 | 4/2004 | Bao et al. .................... 702/189 |

(Continued)

FOREIGN PATENT DOCUMENTS

EP 0 766 144 A1 4/1997

(Continued)

OTHER PUBLICATIONS

European Search Report issued for European Patent Application No. 062508445-2222, dated May 19, 2006.

(Continued)

*Primary Examiner*—Della J. Rutledge
(74) *Attorney, Agent, or Firm*—Pillsbury Winthrop Shaw Pittman LLP

(57) ABSTRACT

A lithographic apparatus includes an illuminator configured to condition a beam of radiation and a support configured to hold a patterning device. The patterning device is configured to pattern the beam of radiation according to a desired pattern. The lithographic apparatus also includes a substrate table configured to hold a substrate and a projection system configured to project the patterned beam onto a target portion of the substrate to form a patterned image on the substrate. The apparatus further includes a sensor configured and arranged to intercept a portion of the beam and to measure a transmission of the beam through at least a portion of the patterning device.

35 Claims, 22 Drawing Sheets

U.S. PATENT DOCUMENTS

| | | | |
|---|---|---|---|
| 6,738,138 B2 | 5/2004 | Wei | 356/369 |
| 6,753,961 B1 | 6/2004 | Norton et al. | 356/364 |
| 6,768,983 B1 | 7/2004 | Jakatdar et al. | 706/46 |
| 6,772,084 B2 | 8/2004 | Bischoff et al. | 702/127 |
| 6,785,638 B2 | 8/2004 | Niu et al. | 702/189 |
| 6,813,034 B2 | 11/2004 | Rosencwaig et al. | 356/601 |
| 6,819,426 B2 | 11/2004 | Sezginer et al. | 356/401 |
| 6,856,408 B2 | 2/2005 | Raymond | 356/601 |
| 6,919,964 B2 | 7/2005 | Chu | 356/601 |
| 6,928,628 B2 | 8/2005 | Seligson et al. | 716/4 |
| 6,972,852 B2 | 12/2005 | Opsal et al. | 356/625 |
| 6,974,962 B2 | 12/2005 | Brill et al. | 250/548 |
| 6,987,572 B2 | 1/2006 | Lakkapragada et al. | 356/601 |
| 7,046,376 B2 | 5/2006 | Sezginer | 356/601 |
| 7,061,615 B1 | 6/2006 | Lowe-Webb | 356/401 |
| 7,061,623 B2 | 6/2006 | Davidson | 356/497 |
| 7,061,627 B2 | 6/2006 | Opsal et al. | 356/601 |
| 7,068,363 B2 | 6/2006 | Bevis et al. | 356/237.5 |
| 2004/0119970 A1 | 6/2004 | Dusa et al. | 356/237.1 |
| 2005/0273753 A1* | 12/2005 | Sezginer | 716/21 |
| 2006/0033921 A1 | 2/2006 | Den Boef et al. | 356/446 |
| 2006/0066855 A1 | 3/2006 | Den Boef et al. | 356/401 |
| 2006/0126074 A1 | 6/2006 | Van Der Werf et al. | 356/489 |
| 2006/0139592 A1 | 6/2006 | Den Boef et al. | 355/53 |

FOREIGN PATENT DOCUMENTS

| | | |
|---|---|---|
| JP | 58-124905 | 7/1983 |

OTHER PUBLICATIONS

Koen Van Ingen Schenau et al., "Scatterometry Based 65nm Node CDU Analysis and Prediction Using Novel Reticle Measurement Technique", Proc. of SPIE, vol. 5752 (2005), pp.1312-1322.

Sonny Y. Zinn et al., "Simulation of Critical Dimension Error Using Monte Carlo Method And Its Experimental Verification", J. Vac. Sci. Technol. B 20(6), Nov./Dec. 2002, pp. 2606-2609.

Donis G. Flagello et al., "Understanding Systematic and Random CD Variations Using Predictive Modelling Techniques", Proc. of SPIE, vol. 3679 (1999), pp. 162-175.

* cited by examiner

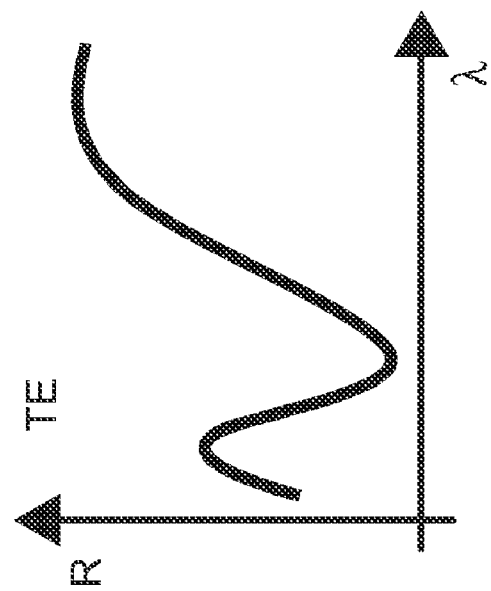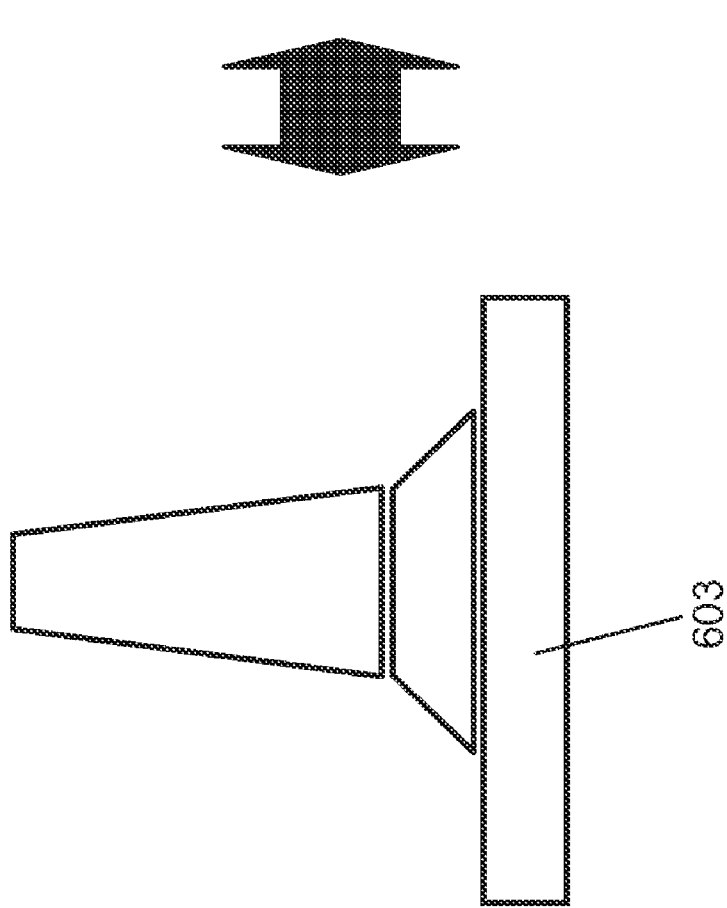
FIG. 6D

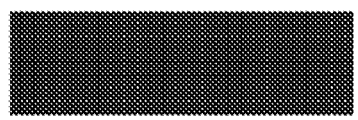
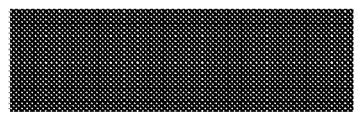
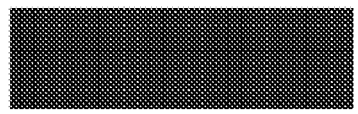
FIG. 10C
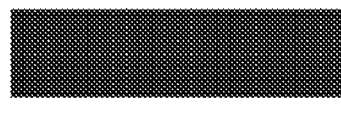
FIG. 10B
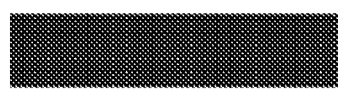
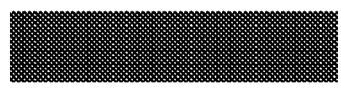
FIG. 10A

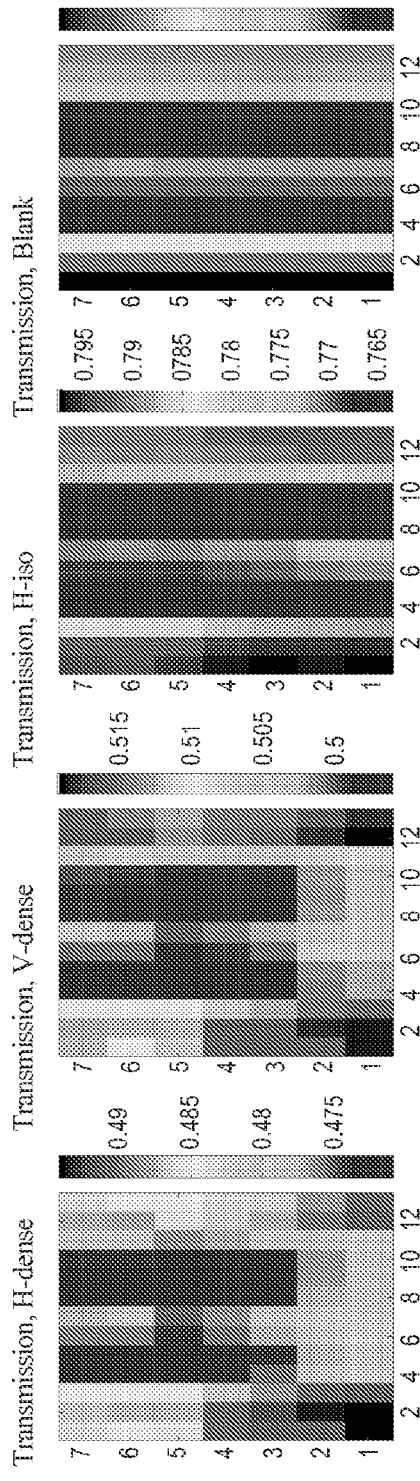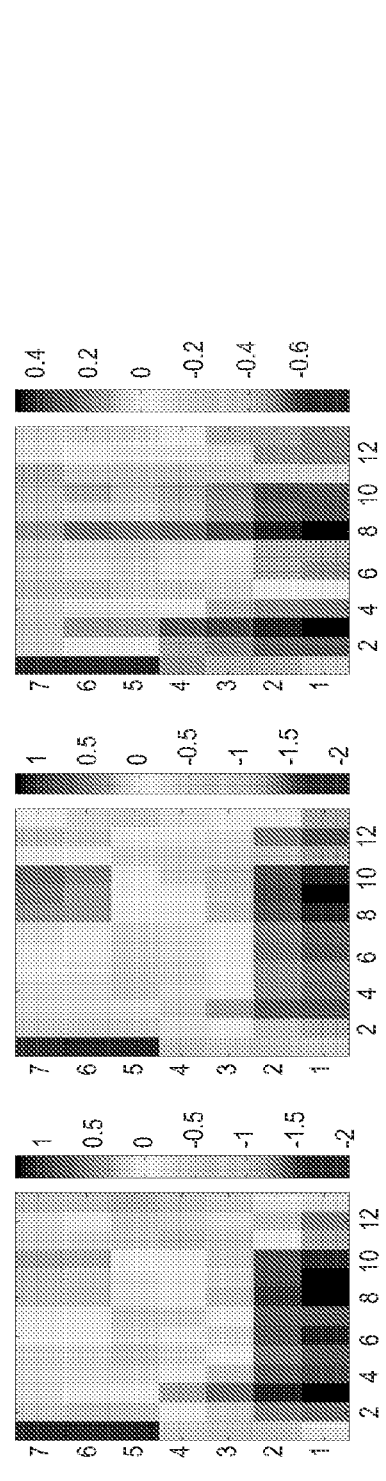

METHOD FOR PREDICTING A CRITICAL DIMENSION OF A FEATURE IMAGED BY A LITHOGRAPHIC APPARATUS

PRIORITY INFORMATION

This application claims priority and/or benefit to U.S. Provisional Patent Application No. 60/655,907, filed Feb. 25, 2005, the contents of which is incorporated by reference in its entirety.

FIELD

The present invention relates to a lithographic apparatus and a method of predicting a critical dimension of a feature imaged by a lithographic apparatus.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion at one time, and so-called scanners, in which each target portion is irradiated by scanning the pattern through the projection beam in a given direction (the "scanning"-direction) while synchronously scanning the substrate parallel or anti-parallel to this direction.

Development of new apparatus and methods in lithography have led to improvements in resolution of the imaged features, such as lines and contact holes or vias, patterned on a substrate, possibly leading to a resolution of less than 50 nm. This may be accomplished, for example, using relatively high numerical aperture (NA) projection systems (greater than 0.75 NA), a wavelength of 193 nm or less, and a plethora of techniques such as phase shift masks, non-conventional illumination and advanced photoresist processes.

However, certain small features such as contact holes are especially difficult to fabricate. The success of manufacturing processes at sub-wavelength resolutions will rely on the ability to print low modulation images or the ability to increase the image modulation to a level that will give acceptable lithographic yield.

Typically, the industry has used the Rayleigh criterion to evaluate the critical dimension (CD) and depth of focus (DOF) capability of a process. The CD and DOF measures can be given by the following equations:

$$CD = k_1(\lambda/NA), \quad (1)$$

and $$DOF = k_2(\lambda/NA^2), \quad (2)$$

where $\lambda$ is the wavelength of the illumination radiation, $k_1$ and $k_2$ are constants for a specific lithographic process, and NA is the numerical aperture.

Additional measures that provide insight into the difficulties associated with lithography at the resolution limit include the Exposure Latitude (EL), the Dense:Isolated Bias (DIB), and the Mask Error Enhancement Factor (MEEF). The exposure latitude describes the percentage dose range where the printed pattern's critical dimension (CD) is within acceptable limits. For example, the exposure latitude may be defined as the change in exposure dose that causes a 10% change in printed line width. Exposure Latitude is a measure of reliability in printing features in lithography. It is used along with the DOF to determine the process window, i.e., the regions of focus and exposure that keep the final resist profile within prescribed specifications. Dense:Isolated Bias (also known as iso-dense bias) is a measure of the size difference between similar features, depending on the pattern density. The MEEF describes how patterning device CD errors are transmitted into substrate CD errors. Other imaging factors that may be taken into account include the pitch. The pitch is a distance between two features such as, for example, contact holes. In a simplified approximation of coherent illumination, the resolution of a lithography system may also be quoted in terms of the smallest half-pitch of a grating that is resolvable as a function of wavelength and numerical aperture NA.

Due to, among other things, variations in exposure and focus, patterns developed by lithographic processes are continually monitored or measured to determine if the dimensions of the patterns are within an acceptable range or to qualify the CD-uniformity (CDU). Monitoring of pattern features and measurement of its dimensions (metrology) is typically performed using either a scanning electron microscope (SEM) or an optical tool. Conventional SEM metrology has very high resolving power and is capable of resolving features of the order of 0.1 micron. However, SEM metrology is expensive to implement, relatively slow in operation and difficult to automate.

Measurements of CD are becoming increasingly challenging with the shrinking dimension of the device. As dimensions of the devices are becoming smaller, the margin of errors in CD of the devices are also decreasing, hence, requiring tighter process windows. As a result, there is a need for a method that would allow the user to extend the CD metrology to the next generation of device fabrication.

SUMMARY

According to an aspect of the present invention, there is provided a lithographic apparatus. The lithographic apparatus includes an illuminator configured to condition a beam of radiation and a support configured to hold a patterning device. The patterning device is configured to pattern the beam of radiation according to a desired pattern. The lithographic apparatus also includes a substrate table configured to hold a substrate and a projection system configured to project the patterned beam of radiation onto a target portion of the substrate to form a patterned image on the substrate. The lithographic apparatus further includes a sensor configured and arranged to intercept a portion of the beam of radiation and to measure a transmission of the beam of radiation through at least a portion of the patterning device.

According to another aspect of the present invention there is provided a method for predicting a critical dimension of a feature imaged by a lithographic apparatus using a model. The method includes inputting a data parameter including a pupil measurement, a projection system aberration, a radiation dose profile, a focus profile, or any combination of the foregoing into the model, inputting patterning device information data related to critical dimension metrology, and inputting process information data related to critical dimension metrology. The method further includes converting the input data to substrate critical dimension uniformity data by using a plurality of simulated and/or measured data of Bossung curves, patterning device error factors, or both.

According to yet another aspect of the present invention there is provided a method for predicting a critical dimension of a feature imaged by a lithographic apparatus using a model. The method includes inputting a data parameter including a pupil measurement, a projection system aberration, a radiation dose profile, a focus profile, or any combination of the foregoing, into the model and performing a spot sensor enabled patterning device measurement to obtain a patterning device information data related to critical dimension. The method further includes inputting the patterning device information data into the model and inputting process information data related to critical dimension metrology into the model. The method also includes converting the input data to substrate critical dimension uniformity data by using a plurality of simulated and/or measured data of Bossung curves, patterning device error factors, or both.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" used herein should be broadly interpreted as referring to any device that can be used to impart a beam with a pattern in its cross-section such as to create a pattern in a target portion of the substrate. It should be noted that the pattern imparted to the beam may not exactly correspond to the desired pattern in the target portion of the substrate. Generally, the pattern imparted to the beam will correspond to a particular functional layer in a device being created in the target portion, such as an integrated circuit.

A patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support structure holds the patterning device in a way depending on the orientation of the patterning device, the design of the lithographic apparatus, and other conditions, such as for example whether or not the patterning device is held in a vacuum environment. The support can use mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system".

The illumination system may also encompass various types of optical components, including refractive, reflective, and catadioptric optical components for directing, shaping, or controlling the beam of radiation, and such components may be referred to below, collectively or singularly, as a "lens".

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

The lithographic apparatus may also be of a type wherein a surface of the substrate is immersed in a liquid having a relatively high refractive index, e.g. water, so as to fill a space between a final element of the projection system and the substrate. Immersion liquids may also be applied to other spaces in the lithographic apparatus, for example, between the patterning device and a first element of the projection system. Immersion techniques are well known in the art for increasing the numerical aperture of projection systems.

The methods described herein may be implemented as software, hardware or a combination. In an embodiment, there is provided a computer program comprising program code that, when executed on a computer system, instructs the computer system to perform any or all of the methods described herein.

BRIEF DESCRIPTION OF THE DRAWINGS

These and other aspects of the invention will become more apparent and more readily appreciated from the following detailed description of the present exemplary embodiments of the invention, taken in conjunction with the accompanying drawings, of which:

FIGS. 6A-D show an overview of a measurement method using scatterometry in accordance with an embodiment of the invention;

FIGS. 10A-C show various pattern of lines with different line/space ratio;

FIGS. 11A-11G show various plots of example full field patterning device transmission measurements for horizontal and vertical dense line gratings, isolated line gratings and blank area of the patterning device;

DETAILED DESCRIPTION

Figure 1:
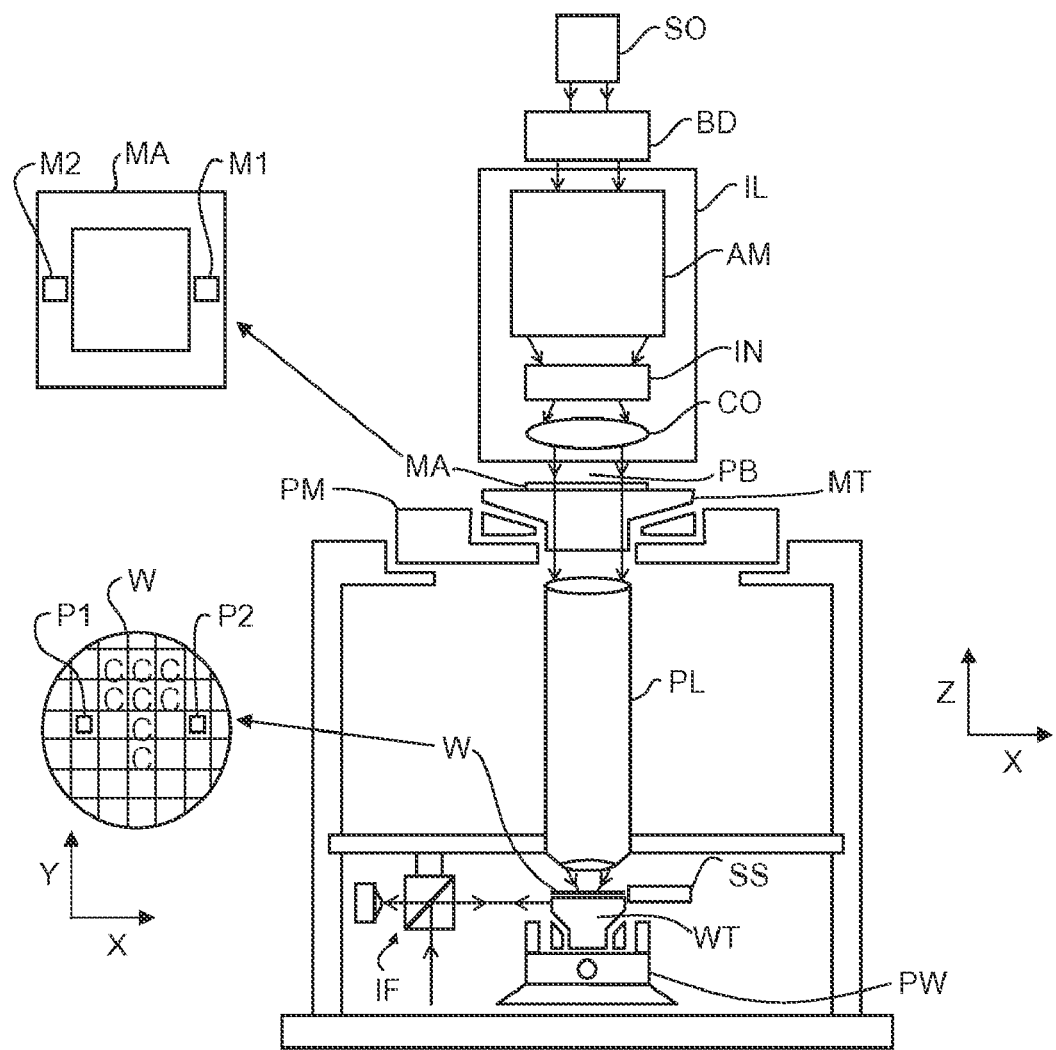
FIG. 1 schematically depicts a lithographic projection apparatus according to an embodiment of the invention.

FIG. 1 schematically depicts a lithographic apparatus according to a particular embodiment of the invention. The apparatus includes:

- an illumination system (illuminator) IL adapted to condition a beam PB of radiation (e.g. UV radiation);
- a support structure (e.g. a mask table) MT configured to hold a patterning device (e.g. a mask) MA and connected to first positioning device PM configured to accurately position the patterning device with respect to item PL;
  - a substrate table (e.g. a wafer table) WT configured to hold a substrate (e.g. a resist-coated wafer) W and connected to second positioning device PW configured to accurately position the substrate with respect to item PL; and
  - a projection system (e.g. a refractive projection lens) PL adapted to image a pattern imparted to the beam PB by the patterning device MA onto a target portion C (e.g. comprising one or more dies) of the substrate W.

The lithographic apparatus also includes on board exposure system metrology sensor spot sensor SS that is configured to measure transmission of the patterning device.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

The illuminator IL may comprise an adjusting device AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation, referred to as the projection beam PB, having a desired uniformity and intensity distribution in its cross-section.

The projection beam PB is incident on the patterning device MA, which is held on the support structure MT. Having traversed the patterning device MA, the projection beam PB passes through the projection system PL, which focuses the beam onto a target portion C of the substrate W. With the aid of the second positioning device PW and position sensor IF (e.g. an interferometric device), the substrate table WT can be moved accurately, e.g. so as to position different target portions C in the path of the beam PB. Similarly, the first positioning device PM and another position sensor (which is not explicitly depicted in FIG. 1) can be used to accurately position the patterning device MA with respect to the path of the beam PB, e.g. after mechanical retrieval from a mask library, or during a scan. In general, movement of the support structure MT and the substrate table WT will be realized with the aid of a long-stroke module (coarse positioning) and a short-stroke module (fine positioning), which form part of the one or both of the positioning devices PM and PW. However, in the case of a stepper (as opposed to a scanner) the support structure MT may be connected to a short stroke actuator only, or may be fixed. Patterning device MA and substrate W may be aligned using patterning device alignment marks M1, M2 and substrate alignment marks P1, P2. The depicted apparatus can be used in the following preferred modes:

1. In step mode, the support structure MT and the substrate table WT are kept essentially stationary, while an entire pattern imparted to the projection beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.
2. In scan mode, the support structure MT and the substrate table WT are scanned synchronously while a pattern imparted to the projection beam is projected onto a target portion C (i.e. a single dynamic exposure). The velocity and direction of the substrate table WT relative to the support structure MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed.

A standard CDU system qualification test uses a "Full Substrate CDU" exposure layout. The CD measurements are taken and the "Across-Field" and "Across-Substrate" CDU values are obtained after modeling. For example, in the case of a pattern of lines, the CD measurements are taken and the across-field line width variations and across-substrate line width variations components are calculated. In order to separate the CD contributions from the exposure system, the patterning device and the process, patterning device (reticle) error correction (REC) and process error correction (PEC) are determined. The final results of the CDU system qualification test are obtained after REC and PEC are determined.

Figure 2A:
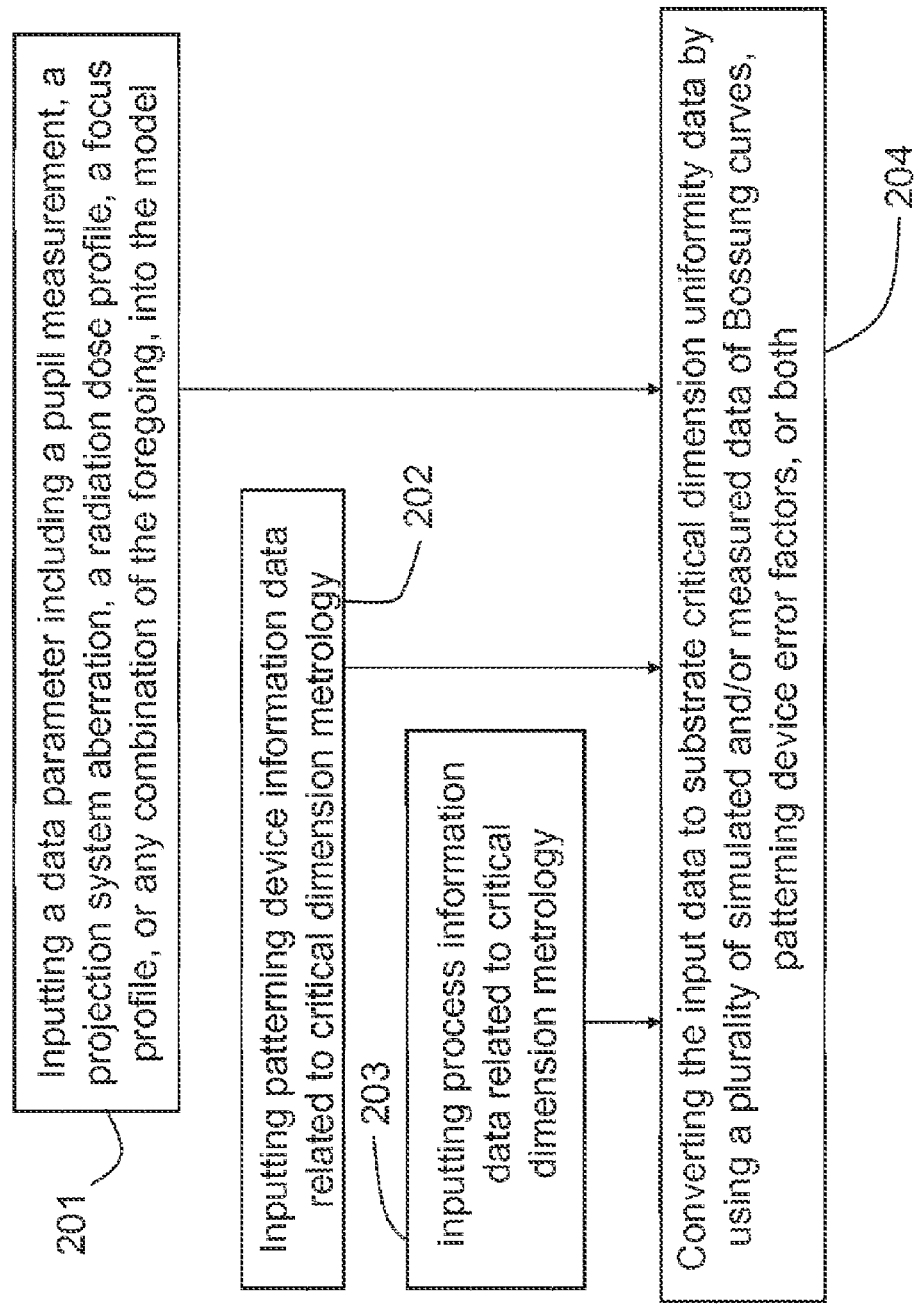
FIG. 2A shows a flowchart of a method of predicting a critical dimension of a feature imaged by a lithographic apparatus using a model, in accordance with an embodiment of the invention.
Figure 2B:
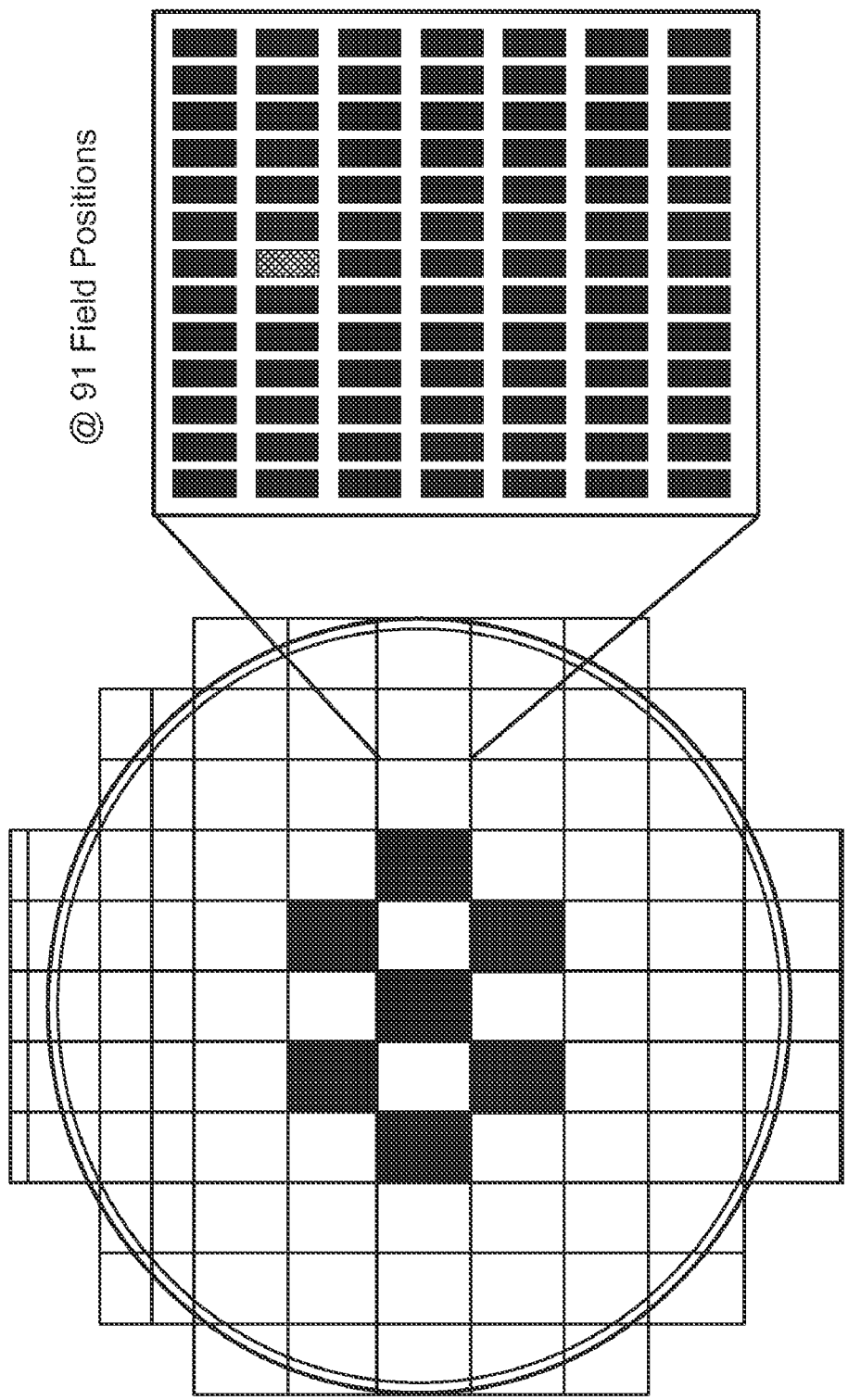
FIG. 2B shows an example of an exposure layout for critical dimension uniformity qualification test.

The inventors have developed a CDU model to enable CD budgeting and predictions. FIG. 2A shows a flowchart of a method of predicting a critical dimension of a feature imaged by a lithographic apparatus using a model, in accordance with an embodiment of the invention. An input of the model is based on the exposure system sub-component data such as measured pupils, lens aberrations, and/or dose and focus profiles and distribution (see block 201). In addition, information related to CD metrology, the process and the patterning device is also input (see blocks 202 and 203). For example, patterning device information may include geometrical information of features of a pattern (e.g. vertical and/or horizontal lines, or holes) in the patterning device. By using multiple simulated or measured Bossung curves and mask (patterning device) error factors (MEF), the input values are converted to full substrate CDU data (see block 204). The subsequent analysis is identical to the experimentally obtained data set. FIG. 2B show an example of an exposure layout for a CDU qualification test performed for a radiation wavelength of 193 nm and a numerical aperture NA of 0.93, according to an embodiment of the present invention.

Figure 3:
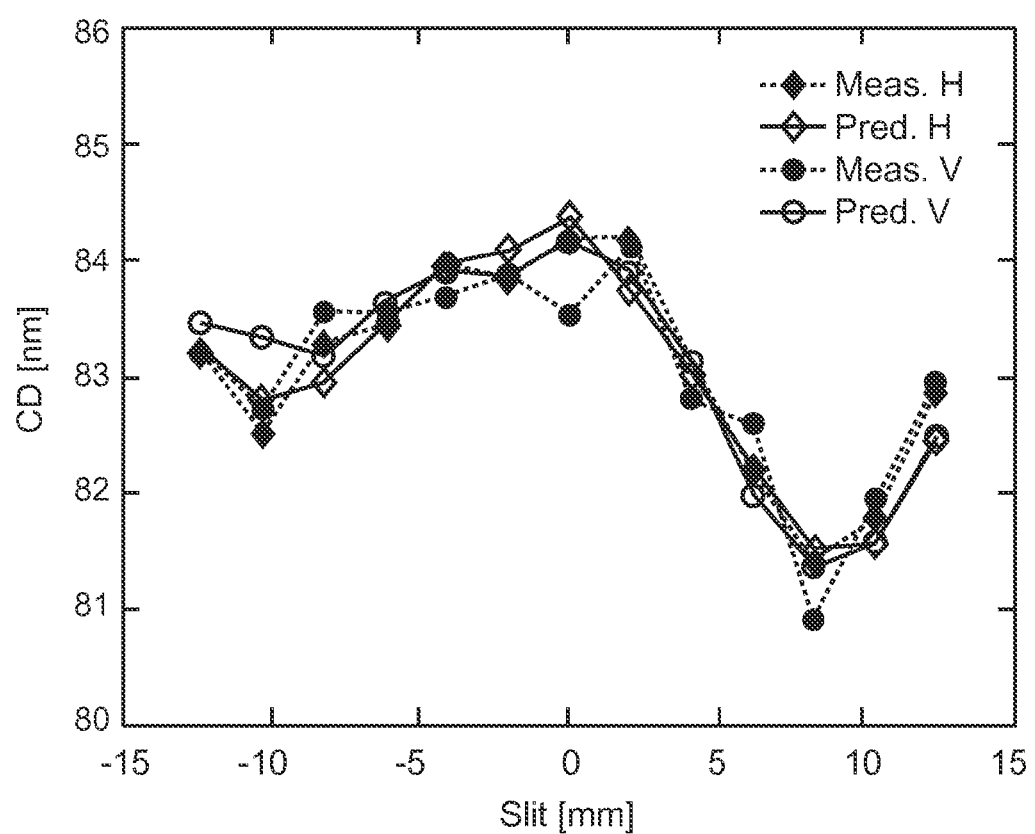
FIG. 3 shows the critical dimension resulting from a simulation in comparison with a measured critical dimension according to an embodiment of the present invention.

FIG. 3 shows the CD resulting from the simulation in comparison with the measured CD for 80 nm isolated lines, according to an embodiment of the present invention. FIG. 3 shows a good correlation of the measured and predicted CD across a slit for the case of 80 nm isolated lines. In FIG. 3, "Meas. H" refers to CD measured for horizontal lines, "Meas. V" refers to CD measured for vertical lines, , "Pred. H" refers to CD predicted for horizontal lines with the simulation, "Pred. V" refers to CD predicted for vertical lines with the simulation. The good match between the simulated and experimental CDU values shows that the model is a powerful tool for predicting CDU modeling and analysis. Hence, CD budgets can be built with this model and can be used to drive system subcomponent requirements and imaging improvements.

The above described CDU predictive model is successful for features with low MEF such as isolated lines. This model, however, may not be adequate for features with high MEF such as contact holes or dense lines. Because of the relatively high level of patterning device CD residuals, the patterning device component starts to dominate the substrate CD budget. Thus, improvements in patterning device CD metrology may be needed in order to separate the patterning device and exposure system CD contributions.

There are two trends that lead to higher MEF: the first one is the drive to smaller pitches—despite the same k1 the MEF increases for smaller pitch. The second one is the drive to lower k1 imaging—for example, from k1=0.35 to 0.31, the MEF increases about 40%.

Figure 4:
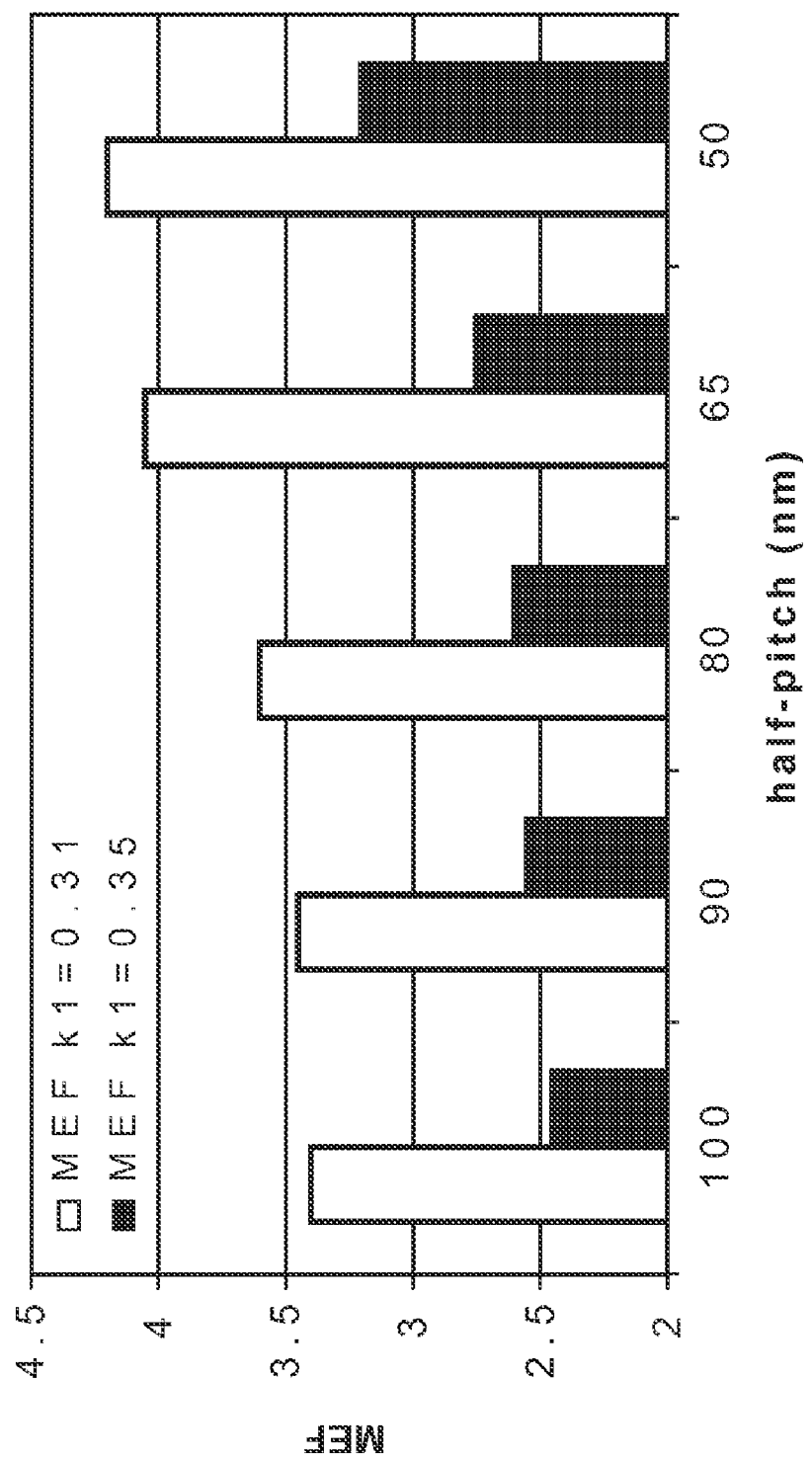
FIG. 4 shows a simulated example of a trend of increasing patterning device error factor at lower k1 values and smaller feature sizes.

To illustrate the MEF role, FIG. 4 shows an example of a trend of increasing MEF with lower k1 (which can be associated with lower half-pitch values) and smaller feature sizes for two k1 values (0.31 and 0.35) using annular illumination and a 6% attenuated phase shift mask (PSM). For example, with a MEF of 5 and a patterning device CD control of $3\sigma$ of 6.5 nm (4x), the resulting wafer CD uniformity would be $3\sigma$ equal to 8.1 nm, which is higher than the International Technology Roadmap for Semiconductors (ITRS) requirement for DRAM.

Figure 5:
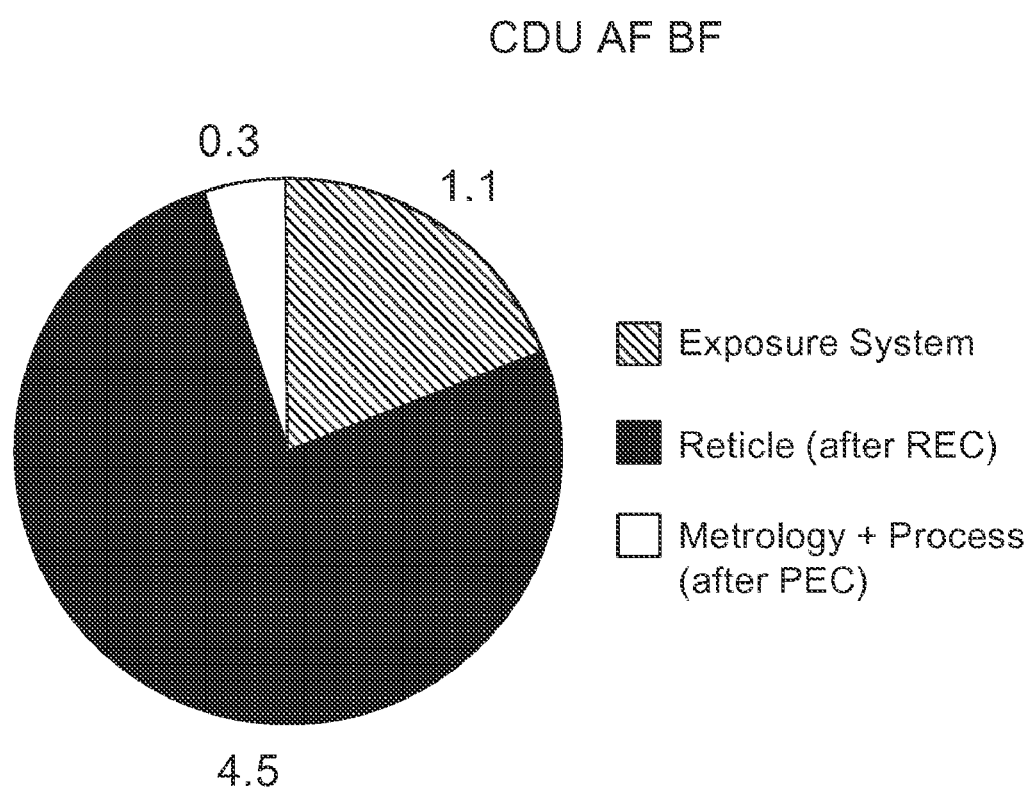
FIG. 5 depicts a distribution of different contributions to the critical dimension budget.

FIG. 5 shows the distribution of different contributions to the CD budget. FIG. 5 shows that the patterning device (reticle) component dominates the across-field budget for 65 nm dense lines (even after performing a REC). It is desirable that only 30% of the obtained CDU results after performing REC and PEC come from non-exposure system contributors. However, as shown in FIG. 5, this is clearly not the case for the present test with 65 nm dense lines.

In order to perform a CDU system qualification test for lines, in an embodiment, an experiment is performed in which 65 nm dense lines are printed with a 0.93 NA step-and-scan exposure system using annular illumination with a $\sigma$ of 0.94/0.74 and with a 6% attenuated PSM. The resist layer deposited on the substrate comprises a stack of 38 nm thick 1C5D BARC™ from AZ Electronic Materials, 150 nm thick TOK-6111™ photoresist from Tokyo Ohka Kogyo, Japan and a 52 nm thick AQUATAR™ from AZ Electronic Materials. CD measurements on the substrate are performed with a NANOMETRICS 8300 scatterometer from Nanometrics Corporation.

In an embodiment of the invention, scatterometry was selected for the CDU system qualification test for lines/spaces with the 0.93 NA step-and-scan exposure system. Scatterometry can allow for a fast measurement, no CD charging, and is non-destructive. Furthermore, scatterometry measurements can be extended to below 40 nm CD measurements. Using CD-SEM, a direct relation between a pattern on the patterning device and a pattern on the substrate can be established. In the case of scatterometry, the average of dozens of lines is measured on the substrate and the measurements are matched down to the nm to patterning device measurements.

Figures 6A, 6B, 6C:
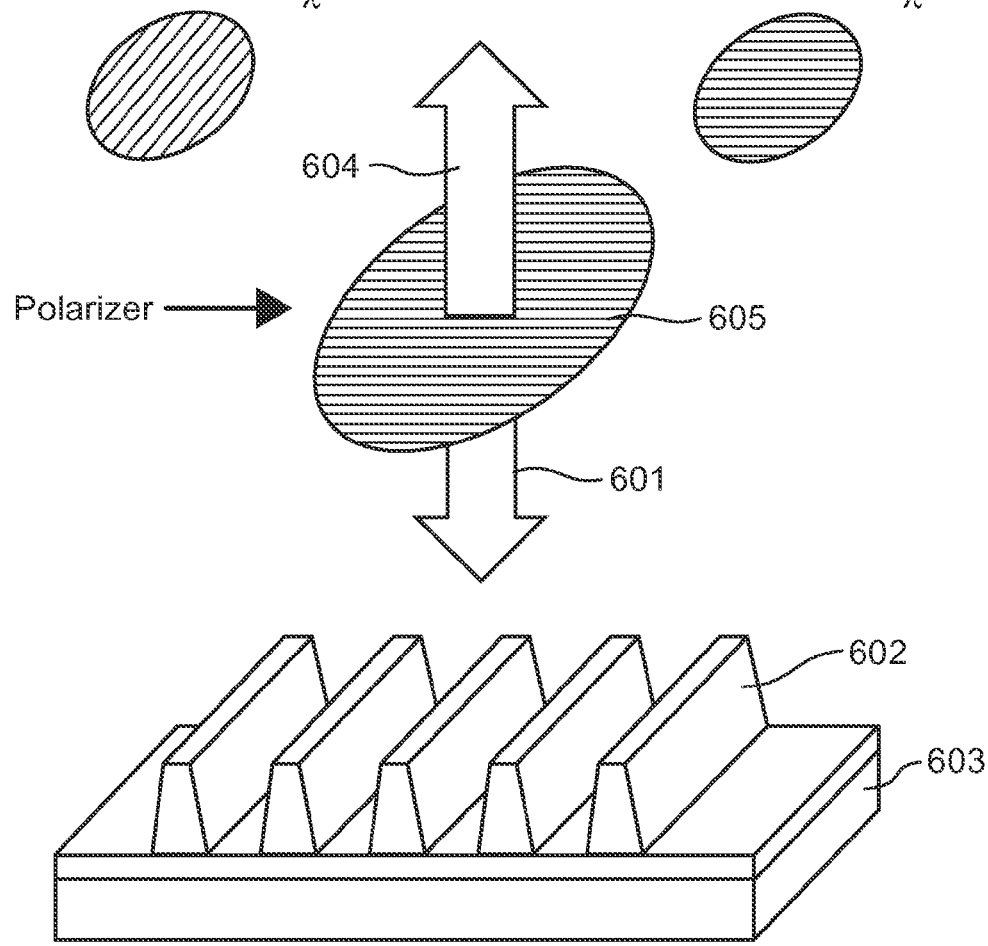

In scatterometry, a beam of broadband light 601 (spot size is 65 μm effectively in an embodiment) is directed to a grating structure 602 patterned onto a substrate 603, and the light 604 scattered from the grating is then collected by a spectrometer. (See FIG. 6A). The reflectance is measured as function of wavelength and polarizer 605 orientation & TE or TM. (See FIGS. 6A-C). The signal (TE or TM) is plotted as function of wavelength (FIG. 6D) and is by means of "library" transformed into a line profile. The library contains information related to the resist properties. Geometrical parameters are then adjusted to fit the measured TE plot (FIG. 6D). In addition to CD information, the spectra from the scattered light contain information about sidewall angle, and thickness of the constituent films.

In an embodiment of the invention, a total test reproduceability (TTR) was obtained for wafer CD measurements using the NANOMETRICS 8300™. For mid-CD definition, the TTR is 1.0 nm ($3\sigma$) for 65 nm dense lines, the TTR is 0.5 nm ($3\sigma$) for 65 nm isolated lines (1:6) and finally the TTR is 0.5 nm ($3\sigma$) for 40 nm semi-dense (1:3) lines. The mid-CD definition was selected over top-CD and bottom-CD definitions because of better TTR, better correlation with CD-SEM and lower sensitivity to process noise.

To provide CDU system qualification, the scatterometry substrate CD measurements are correlated with the conventional CD-SEM measurement for 65 nm lines. The correlation data shows that the CD scatterometry measurement and the traditional CD-SEM measurements are matching.

Figure 7A:
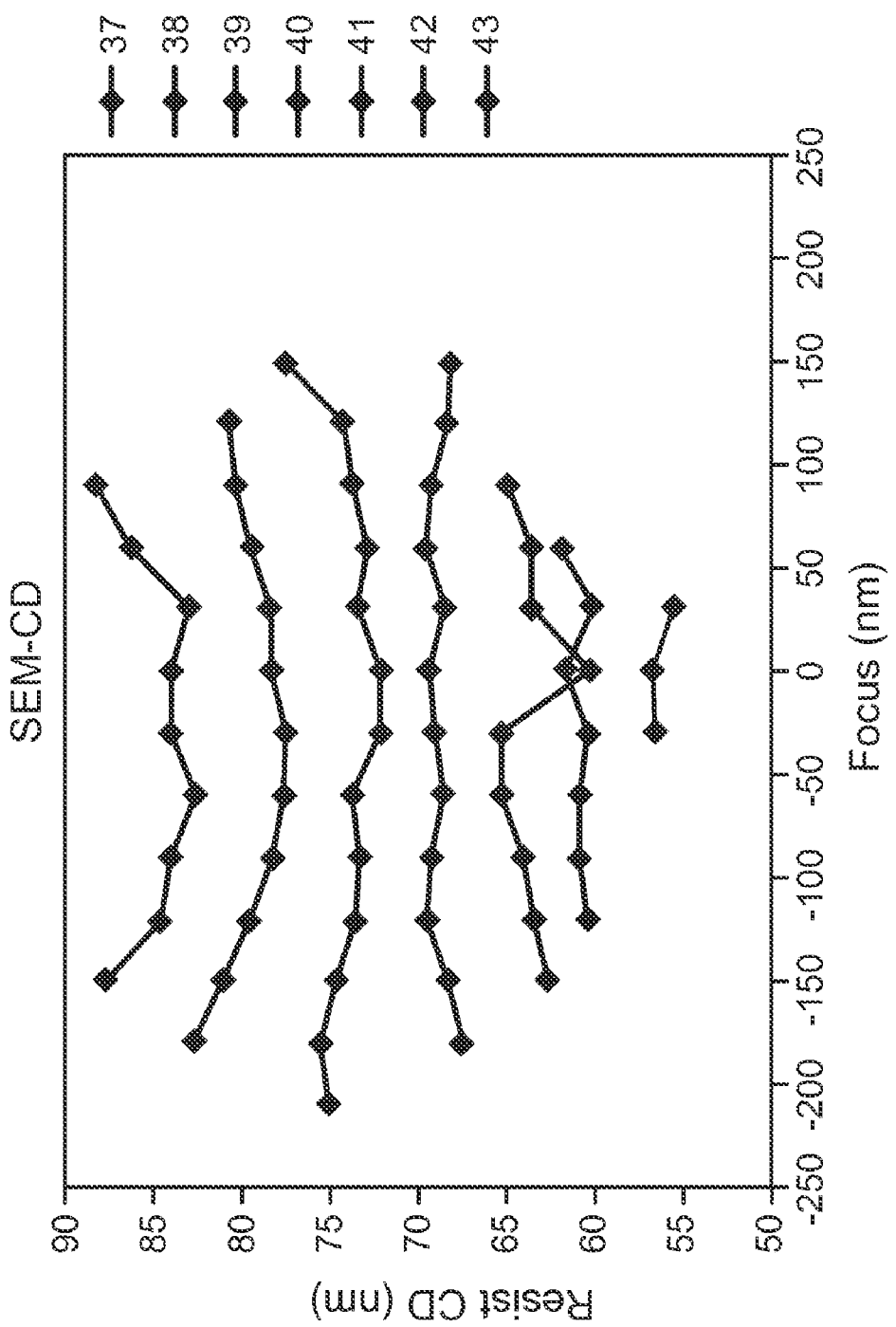
FIGS. 7A-C show an example of correlation between scatterometry mid-CD and CD-SEM measurements for 65 nm dense lines.
Figure 7B:
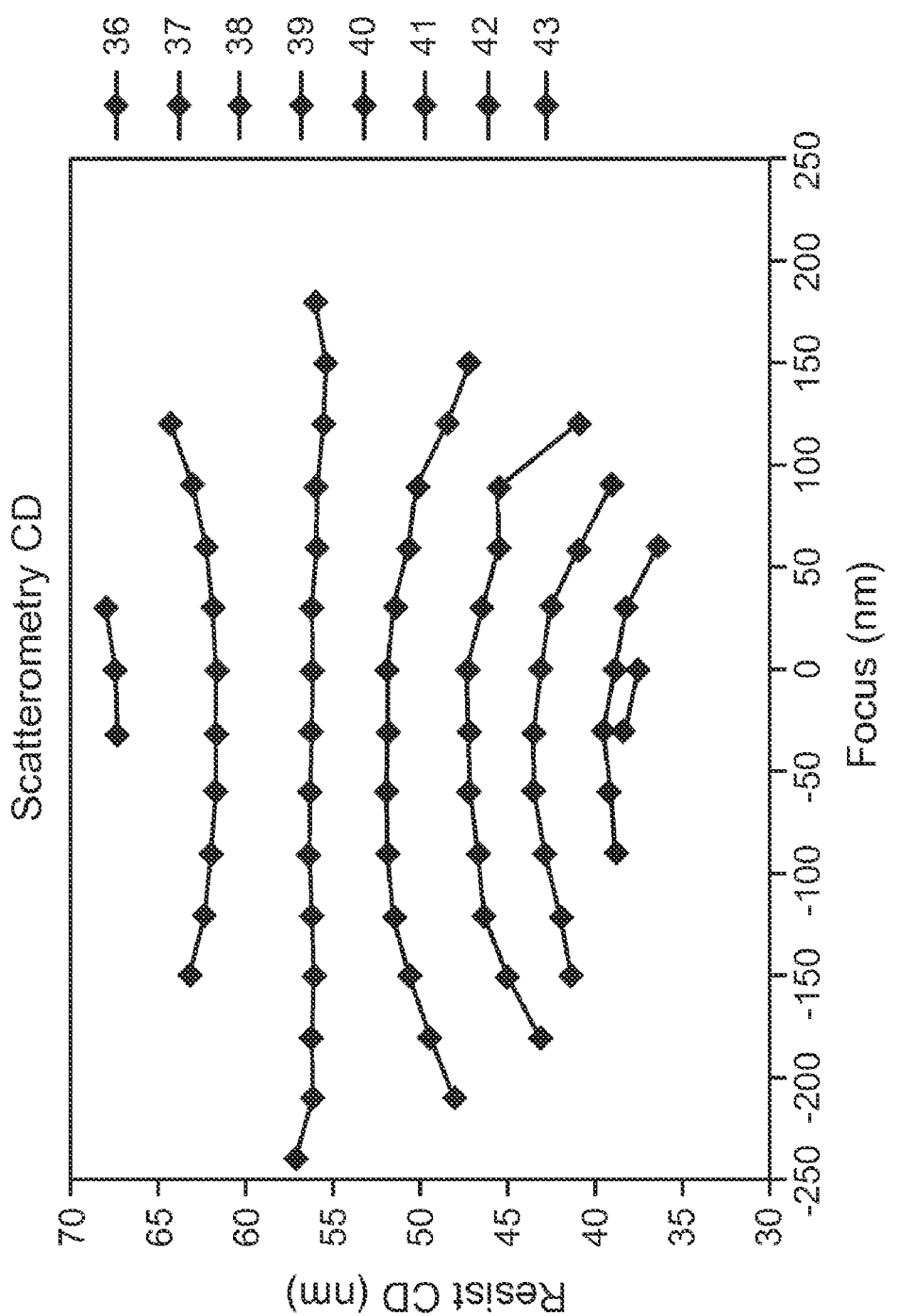
Figure 7C:
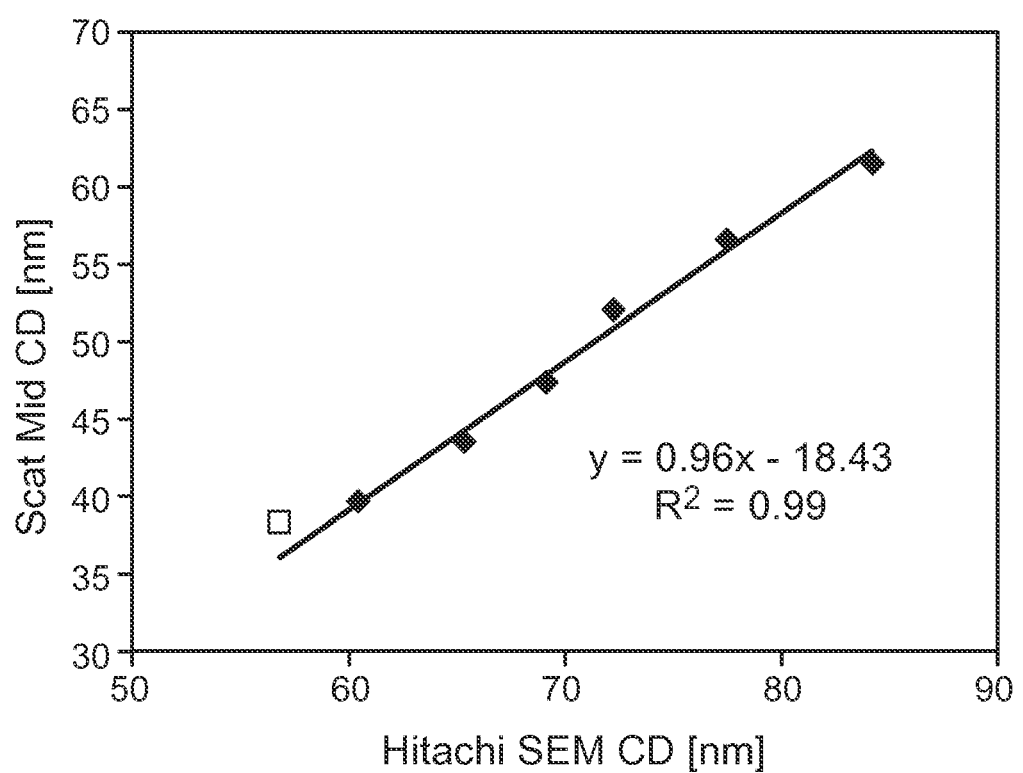

FIGS. 7A-C show the correlation between scatterometry mid-CD and CD-SEM measurements for 65 nm dense lines. FIG. 7A shows the Bossung curves (CD versus focus for different exposure energies (mJ/cm$^2$)) obtained with a CD-SEM. FIG. 7B shows the Bossung curves obtained with scatterometry. FIG. 7C shows the correlation at best focus.

As can be seen in FIGS. 7A-B, a much smoother Bossung curve for the scatterometry mid-CD is obtained. Furthermore, FIG. 7C shows that good linearity correlation was obtained between the scatterometry mid-CD and CD-SEM measurements for 65 nm dense lines, with a slope of 1.0±0.1.

The CDU system qualification of state-of-the-art scanners may be hampered by the CD variations across the patterning device. Even after applying REC, the contribution of the patterning device to CDU can remain high. The current REC procedure includes LWM or SEM measurement of the patterning device CD, determining how a CD error on the patterning device translates into a resist CD error (i.e. MEF: Mask Error Factor), and subtracting this contribution from the measured resist CD distribution. LWM is a metrology tool for automatic measurement of a substrate developed by LEICA Microsystems that includes a deep ultra-violet (DUV) optical microscope.

CD measurements with the LWM, have a reproducibility of $3\sigma$ equal to 4 nm (4×). Therefore, if, for example, the MEF is 4, the minimum expected substrate CDU is $3\sigma$ of 4 nm for a "perfect" exposure system.

Figure 8B:
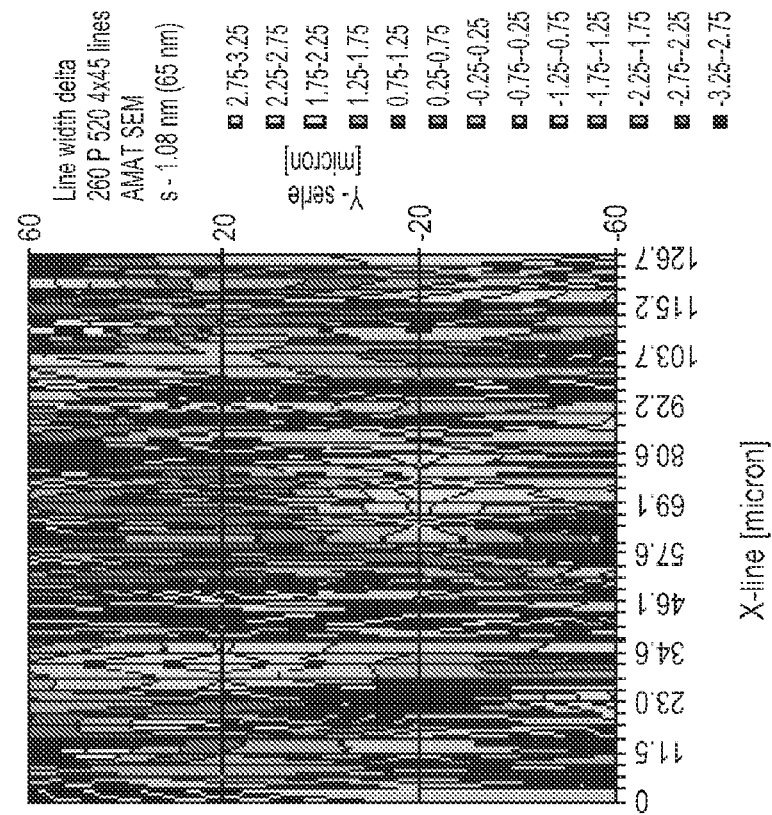
FIGS. 8A and 8B depict an example of patterning critical dimension uniformity within, respectively, a 60 nm scatterometry grating module and a 65 nm scatterometry grating module.
Figure 8A:
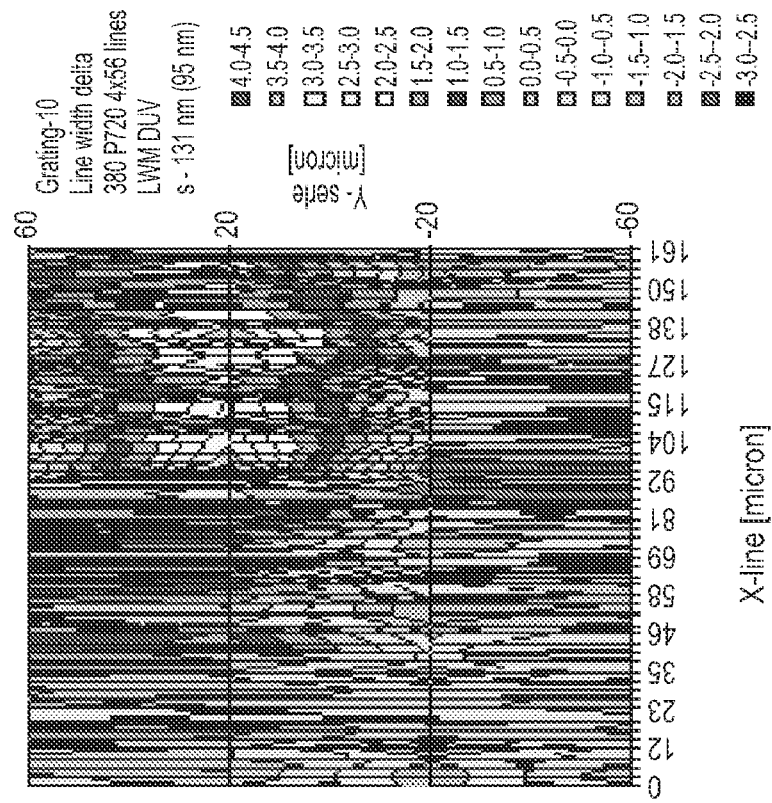

The reproducibility of an Applied Materials patterning device CD-SEM is better with $3\sigma$ of 1 nm (4×). For both LWM and CD-SEM for the case of scatterometry grating measurements, multiple positions within the grating should be measured. In CD-SEM scatterometry grating measurements for 65 nm, results have shown that intra-grating CDU is about 70% of the total reticle CDU and dominated by random effects. For reticle error correction (REC), nine reticle CD measurements within the grating are used with specific locations depending on the scatterometer spot size. FIG. 8A shows patterning CD uniformity within a 90 nm scatterometry grating module and FIG. 8B shows patterning CD uniformity within a 65 nm scatterometry grating module.

One requirement for patterning device CD qualification of scatterometry gratings initiated the present method for patterning device (reticle) measurements. The method is called SERUM (Spot sensor Enabled Reticle Uniformity Measurements). This method uses an on board exposure system metrology sensor (a spot sensor SS), i.e., in the lithographic apparatus, to measure transmission that is converted to reticle CD.

In an embodiment of the invention, the across field patterning device transmission can be measured by the spot sensor SS located in the substrate stage. When measuring the transmission of identical gratings (by design), spread across the patterning device, the transmission values can be converted into a patterning device CD fingerprint. This fingerprint, in turn, can then be used for reticle (patterning device) error correction (REC).

In an embodiment of the invention, patterning device CD measurements can be carried out without the protective pellicle mounted to the patterning device. Alternatively, measurements can be carried out with the protective pellicle on.

To be able to exclude effects of illumination uniformity (and non-uniform patterning device blank transmission), reference uniformity measurements were taken through clear areas of the patterning device. One of the benefits of using the SERUM method is that measurement of 91 points for two orientations across the reticle (including normalization measurements) takes less than approximately two minutes. Furthermore, spot sensor repeatability is 0.1% ($3\sigma$), translating into a theoretical patterning device CD measurement repeatability of less than 0.1 nm ($3\sigma$, 4×).

Figure 9C:
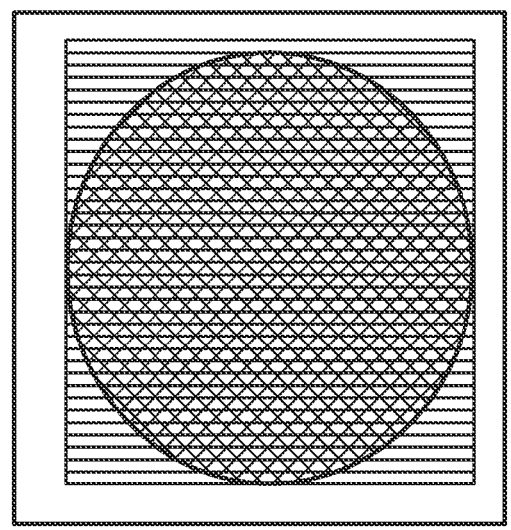
FIG. 9C schematically shows a 120 μm spot sensor diameter in a 120 μm size module.
Figure 9B:
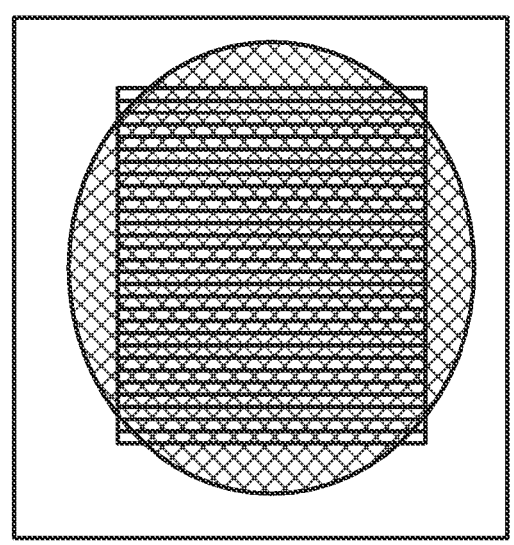
FIG. 9B schematically shows a 120 μm spot sensor diameter in the standard 80 μm grating module.
Figure 9A:
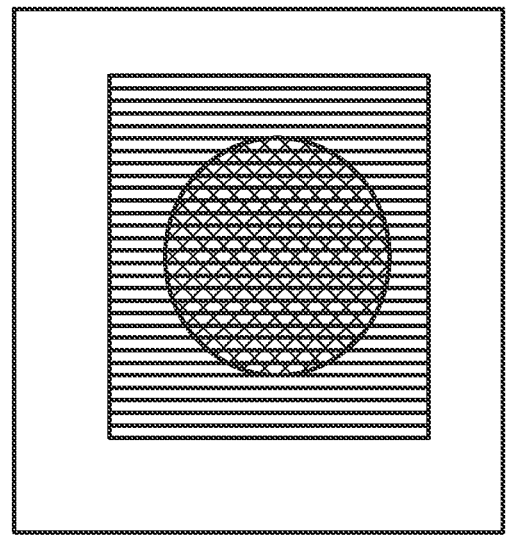
FIG. 9A schematically shows a 60 μm diameter scatterometer spot in a standard 80 μm grating module.

Referring to FIG. 9A, this figure shows the 60 μm diameter scatterometer spot in the standard 80 μm grating module. Referring now to FIG. 9B, the spot sensor diameter is about 120 μm, which is larger than the scatterometer spot and the standard grating module. In an embodiment, in order to accommodate the SERUM technique, a patterning device was made with various sizes of scatterometry grating modules including a 120 μm size module (FIG. 9C).

In an embodiment, in order to exclude effects of first and higher diffraction orders, the SERUM measurements are done in a sub-resolution NA/illumination mode where only zero$^{th}$ diffraction orders can reach the spot sensor on the substrate stage. As a result, the transmission for equal lines/spaces is 0.25; due to geometrical effects a dense grating blocks half the light. Furthermore, the small grating pitch (160 nm) combined with the moderate lens NA=0.60 and 248 nm wavelength, results in only the zero$^{th}$ diffraction order reaching the spot sensor, which is again half the light. Any variation in duty cycle translates into a different zero$^{th}$ order transmission at substrate level. In case the patterning device CD increases, the transmission decreases and vice versa. Using this concept the measured transmission variation across the patterning device can be converted into a patterning device fingerprint. FIGS. 10A-C show the image intensity (zeroth order transmission) as a function of patterning device CD for a binary 80 nm L/S patterning device. In FIG. 10A, the line/space dimensions of the pattern are about 280/360 nm and the transmission is about 31%. In FIG. 10B, the line/space dimensions of the pattern are about 320/320 nm and the transmission is about 25%. In FIG. 10C, the line/space dimensions of the pattern are about 360/280 nm and the transmission is about 19%.

In an embodiment of the invention, first SERUM measurements were performed with a 80 nm L/S binary mask (patterning device) using a radiation beam having a wavelength of 248 nm and the numerical aperture of the exposure system being 0.75. In this case, the k1 value is equal to 0.24. With these values, SERUM is possible because it is based on zero$^{th}$ order light transmission measurements. A standard size grating was used in this embodiment (see FIG. 9B).

FIGS. 11A-11G show various plots of full field patterning device transmission measurements for horizontal and vertical dense line gratings, isolated line gratings and blank area. The transmission values are given as a spot sensor (SS)/energy sensor (ES) ratio. That is, a transmission without a patterning device gives 1. The top row contains the measured full field reticle (patterning device) transmission for horizontal and vertical dense gratings, horizontal isolated gratings and blank area. The values are given as SS/ES ratio. The bottom row contains the full field transmission fingerprints after dividing by the blank transmission and normalization. FIGS. 11E-11G show the relative transmission (Tcorr). For example, the calculation for horizontal dense lines is given by the following equation.

$$Tcorr_{H\,dense} = \left(\frac{T_{H\,dense}/T_{Blank}}{\mathrm{mean}(T_{H\,dense}/T_{Blank})} - 1\right) * 100$$

Two results require a more detailed explanation as these results are affected by a number of issues. A first issue is the measured transmission of approximately 0.50 for dense gratings. Due to geometrical effects, a dense grating blocks half the light. Furthermore, the small grating pitch (160 nm) combined with the moderate lens NA of 0.60, results in only the zeroth diffraction order reaching the spot sensor (which is again half the light). The net result is an effective transmission of 0.25, not the measured 0.50. The reason for this discrepancy is shown in FIG. 9B which shows an area covered by the spot sensor relative to an area of the grating. As shown in FIG. 9B, a large part of the light reaches the spot sensor through a clear surrounding. Another point that needs to be addressed is the difference between the mean transmission for horizontal and vertical dense lines. This is most likely due to a mis-positioning of the spot sensor with regard to the reticle gratings which can be in the order of 10 μm. As a result, the inventors have determined that due to these experimental imperfections the REC may be less effective if there were no imperfections at all. However, the experiment still indicates the feasibility of SERUM. The inventors have determined that these imperfections can be taken into account and measurements adjusted accordingly. For example, the positioning of the spot sensor can be adjusted or the area of the spot sensor falling outside the grating region may be obscured to eliminate the additional light that may be reaching the spot sensor. In addition, the mis-positioning of the spot sensor with regard to the grating can be corrected, for example, by fine-tuning the position of the spot sensor relative to the grating area. Alternatively, a larger grating could be used, as shown in FIG. 9C.

In another embodiment, SERUM measurements were performed in combination with a phase shift mask. For a phase shift mask, the SERUM zero$^{th}$ order transmission measurements not only depends on the mask CD but also on phase and mask transmission.

Figure 12A:
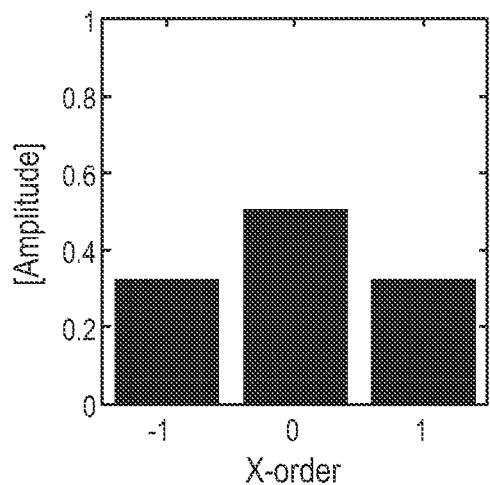
FIGS. 12A-D show the simulated amplitude of the zeroth and the first diffraction orders (positive and negative) for a pattern of 65 nm lines arranged in a 65 nm pitch for different patterning device types.
Figure 12B:
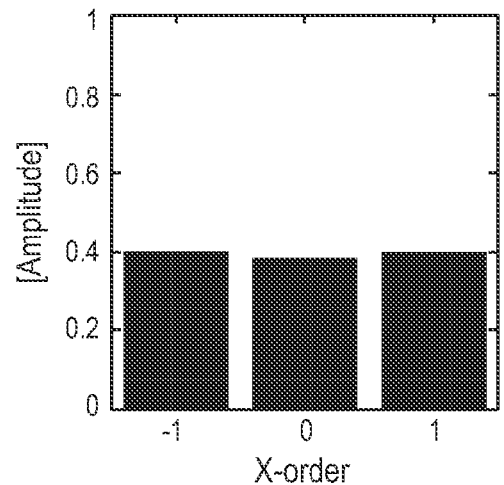
Figure 12C:
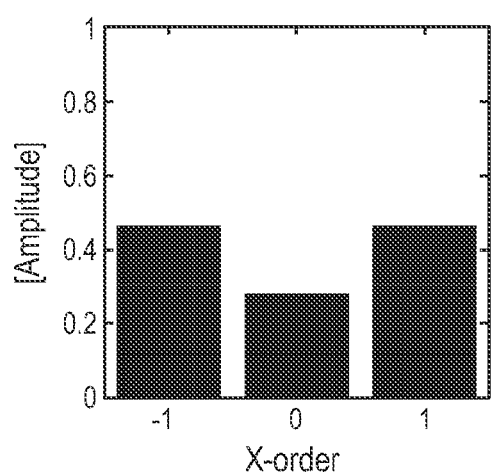
Figure 12D:
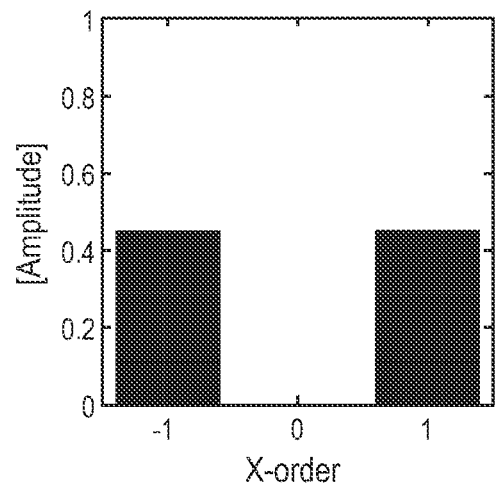

Referring to FIGS. 12A-D, these figures show the amplitude of the zeroth and the first diffraction orders (positive and negative) for a pattern of 65 nm lines arranged in a 65 nm pitch (hereinafter referred to as "65 nm L/S"), and for a 193 nm radiation wavelength and a numerical aperture of about 0.93. Results are given for a binary mask (FIG. 12A), a 6% attenuated phase shift mask (FIG. 12B), a 20% phase shift mask (FIG. 12C) and an alternating phase shift mask (FIG. 12D).

As can be seen in FIGS. 12A-D, the overall mask transmission for a phase shift mask is higher than for a binary mask (see first diffraction order), but the zero$^{th}$ order transmission that is measured with SERUM is lower because more light is shifted to the first and higher orders. In case SERUM measurements are performed at moderate NA, the first diffraction orders will not be captured by the projection lens and only the zero$^{th}$ order transmission will be measured. For an attenuated phase shift mask with 100% transmission and for an alternating phase shift mask with 180 degrees phase, the SERUM zero$^{th}$ order transmission measurements is expected to be close to zero because all light is shifted to the first and higher orders.

SERUM measurements of phase shift masks at non-actinic wavelength are possible but both mask phase and transmission are wavelength dependent. For example a 193 nm dedicated 6% attenuated PSM with a 72 nm MoSi absorber has about 27% transmission and about 130 degrees phase at 248 nm wavelength. The phase of a phase shift mask can be determined by combining actinic and non-actinic wavelength SERUM measurements. Only the latter is sensitive to phase. Using modeled sensitivities or SERUM measurements of a MEF module, the patterning device (reticle) component can be taken out, yielding the phase information. Furthermore, in an embodiment of the invention, phase measurements of attenuated phase shift mask can be carried out in situ.

Figure 13:
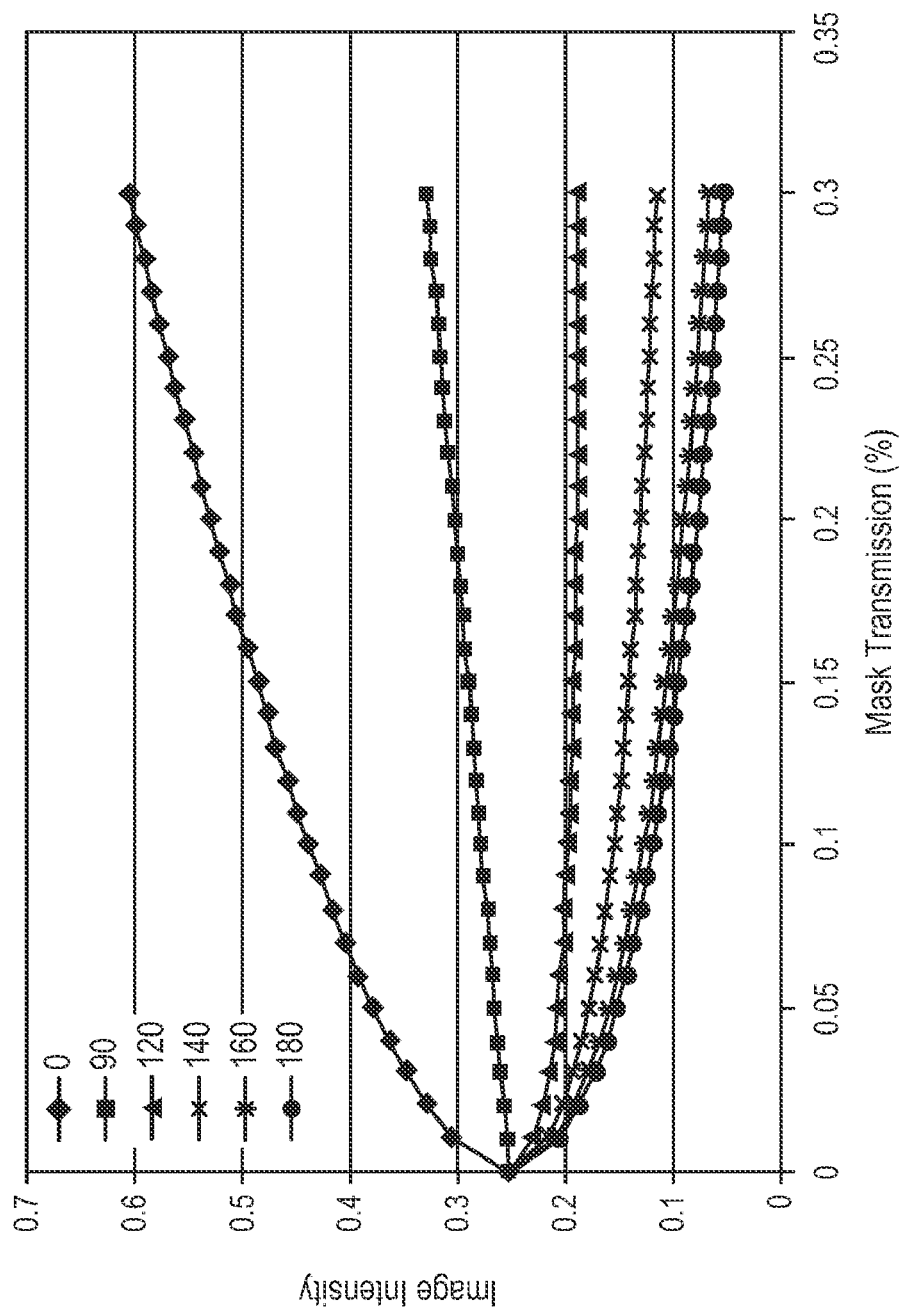
FIG. 13 shows the simulated image intensity of the zero$^{th}$ order transmission as a function of phase and transmission of the patterning device.

FIG. 13 shows the image intensity of the zero$^{th}$ order transmission as a function of a phase and transmission of the patterning device.

As can be seen in FIG. 13, the image intensity is about 0.25 for binary masks at 0% mask transmission. When a 180 degree phase shift mask is used, the image intensity reduces with mask transmission because more light is shifted to the first orders. For a 6% attenuated PSM, with mask transmission about 6% and the phase 180 degrees, the image intensity is about 0.14. For SERUM measurements of a 193 nm dedicated 6% attenuated PSM at 248 nm wavelength, the image intensity is expected to be about 0.15.

Table 1 shows the SERUM sensitivities and typical ranges on the mask for a 6% attenuated phase shift mask with a 65 nm L/S.

TABLE 1

| Sensitivities | λ = 193 nm | λ = 248 nm | Typical range on mask | |
|---|---|---|---|---|
| dCD/dI (4x) | 5.5 nm/% | 7.0 nm/% | ΔCD | 7 nm |
| dΞ/dI | ∞ | 4.4°/% | ΔΞ | 2.7° |
| dT/dI | 1.3 | 1.8 | ΔT | 0.02% |

Because of the low mask transmission variation, this can be neglected. However, the phase variation on the mask is significant in case of non-actinic wavelength measurements. The 2.7° phase range leads to 0.6% image intensity range which equals 4.2 nm reticle CD variation.

In an embodiment, SERUM measurements were performed with a radiation having a wavelength of 248 nm using a projection system having a NA of 0.75. In this embodiment, a 6% attenuated PSM (193 nm) is used and 65 nm L/S scatterometry gratings are measured. The transmission at 248 nm becomes 20% instead of 6% and the phase at 248 nm becomes 140° instead of 180°, which results in a large impact on the reticle CD sensitivities. On the other hand, variations of transmission and phase can be neglected as they are small and have low sensitivity.

The patterning device CD measurements obtained with SEM and SERUM are correlated. A good correlation is obtained between the patterning device CD measurements obtained with SEM and SERUM for the 80 nm binary mask/patterning device. In addition, the patterning device CD measurements obtained with SEM for the 80 μm module (see FIG. 9A) and SERUM for the 80 and 120 μm module (see FIGS.

Figure 14A:
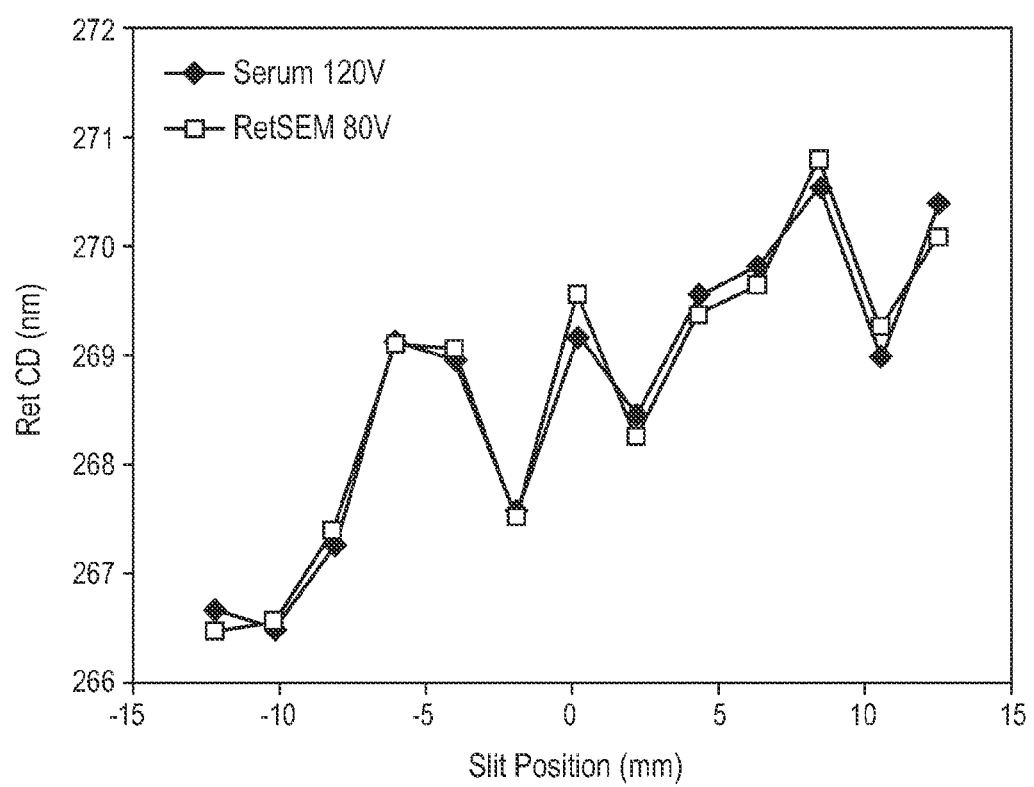
FIGS. 14A-B show, respectively, example SERUM-SEM reticle CD correlation for 65 nm dense lines across-slit (FIG. 14A) and across-field point to point (FIG. 14B)
Figure 14B:
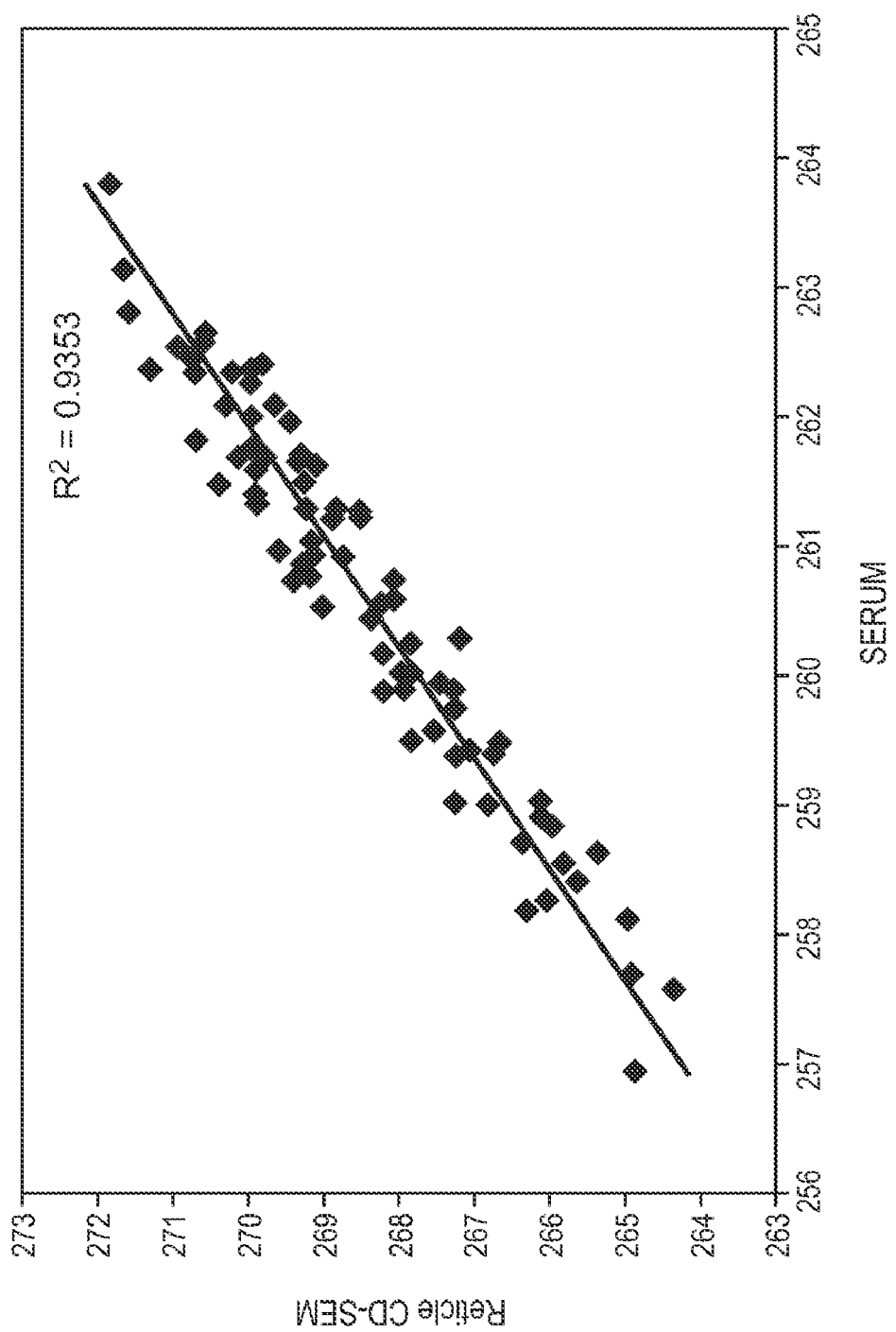

9B-C) were compared for the 65 nm L/S attenuated phase shift mask. FIGS. 14A-B show, respectively, SERUM-SEM reticle CD correlation for 65 nm dense lines across-slit (FIG. 14A) and across-field point to point (FIG. 14B).

As can be seen in FIGS. 14A-B, a good correlation exists between 80 µm module patterning device CD SEM measurements and the SERUM 120 µm module measurements for the 65 nm vertical dense lines. The figure shows the excellent correlation ($R^2$=0.97, DRMS=0.2 nm) of the patterning device CD fingerprint across the slit after small offset and sensitivity corrections. Also, a good correlation ($R^2$=0.93, DRMS=0.4 nm) is obtained for the individual across-field points. The delta RMS still includes some systematic differences due to phase error and the different modules compared.

REC was applied to data sets of 65 nm and 80 nm CDU system qualification using SEM based scatterometry grating measurements.

In order to test whether SERUM works well, the patterning device transmission for 80 nm dense scatterometry gratings is measured and used to correct the CDU measurement results obtained with the patterning device using 193 nm radiation and a projection system having a NA of 0.85.

Table 2 shows the CDU measured and the CDU obtained after application of REC to SERUM for vertical and horizontal lines. A large CDU improvement after REC by SERUM can be seen, especially with respect to horizontal lines. However, as discussed above, the current experiment suffered from a number of issues, for example the diameter of the spot sensor being greater than the grating area, misalignment of spot sensor with regard to the grating. As discussed above, these issues may be taken into account and corrected and hence the results can be improved.

TABLE 2

| CDU [nm 3σ]    | H-dense | V-dense |
|----------------|---------|---------|
| Measured       | 8.12    | 8.75    |
| After SERUM REC| 3.25    | 5.80    |

Figure 15:
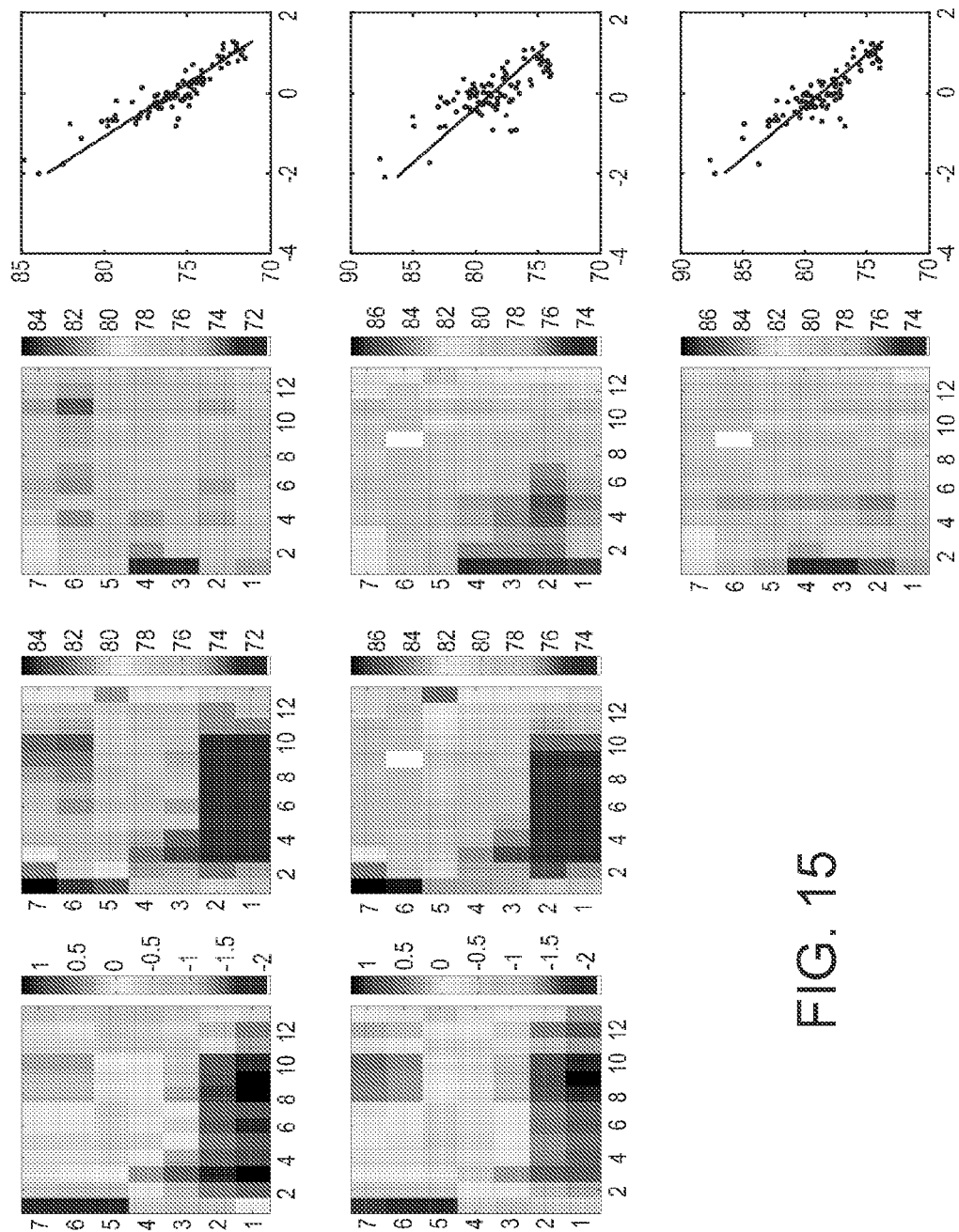
FIG. 15 shows an example of transmission fingerprint corrected for illumination uniformity and normalized for patterning device error correction, according to an embodiment of the present invention.

The transmission fingerprint, corrected for illumination uniformity and normalized, is used for REC as shown in FIG. 15. FIG. 15 shows Tcorr (patterning device transmission corrected by blank measurement as a %) for dense lines (first column) and the measured CD fingerprint CDraw (second column) for a horizontal dense grating (first row) and a vertical dense grating (second row). The plots in the last column show the correlation between Tcorr and CDraw. The residues of this fit are visualized in the plots in the third column, i.e. the CD fingerprint after applying REC. The lower row shows the correlation between the CD fingerprint of vertical dense lines with the transmission measurements of a horizontal dense grating (last column) and the residues when correcting the measured CD fingerprint of the vertical dense grating with the Tcorr of the horizontal dense grating. Surprisingly, this results in an even lower CDU value. This is most likely due to the measurement imperfections. The correlation results corresponding to FIG. 15 are summarized in Table 3. In this evaluation correction of isolated lines was not performed.

TABLE 3

|                      |               | $H_{dense}$   |       |          | $V_{dense}$   |       |          |
|----------------------|---------------|---------------|-------|----------|---------------|-------|----------|
| REC grating          | Normalization | Slope [nm/%]  | $R^2$ | 3σ [nm]  | Slope [nm/%]  | $R^2$ | 3σ [nm]  |
| —                    | —             | —             | —     | 8.12     | —             | —     | 8.75     |
| H & V dense, resp    | Blank area    | −3.77         | 0.84  | 3.25     | −3.68         | 0.56  | 5.80     |
| H dense              | Blank area    |               |       |          | −3.88         | 0.77  | 4.18     |

The slope $\partial CD_{wafer}/\partial I$ can be estimated without CD-data. For example, this can be done by calculating the intensity change at substrate level due to patterning device CD variation (a first step). This can be done with an aerial image simulator, for example Puptool. Since the spot sensor diameter (Ø=120 µm) is larger than the grating size (80×80 µm$^2$), see FIG. 8B, only part of the measured signal is due to transmission through the grating. Taking the area of the spot sensor and the area of the grating and the geometrical and diffraction effects into account, 24.6% of the measured intensity at wafer level can be ascribed to the grating transmission. The final two steps are converting patterning device CD via the experimental MEF to wafer CD and taking one over.

TABLE 4

| | | |
|---|---|---|
| $\left(\dfrac{\partial I}{\partial CD_{ret}}\right)_{only\_grating} =$ | −2.50 [%/nm] | |
| $\left(\dfrac{\partial I}{\partial CD_{ret}}\right)_{clear\_surrounding\ and\_grating} =$ | −0.62 [%/nm] | × 24.6% (ratio transmission through grating vs clear surroundiungs) |
| $\left(\dfrac{\partial I}{\partial CD_{wafer}}\right)_{clear\_surrounding\ and\_grating} =$ | −0.164 [%/nm] | × 1/MEF (MEF = 3.75) |
| $\left(\dfrac{\partial CD_{wafer}}{\partial I}\right)_{clear\_surrounding\ and\_grating} =$ | −6.1 [%/nm] | 1/x |

This slope number is comparable to that of Table 3. The difference is most likely caused by the previously discussed imperfections of the measurements. The across-field CDU for 65 nm and 80 nm dense lines after REC was compared using two patterning device CD datasets (those obtained with CD-SEM and those obtained with SERUM).

In an embodiment, SERUM based REC was applied to a CDU data set for 65 nm dense lines using a 6% attenuated phase shift mask, a numerical aperture of about 0.93 and an annular illumination. Table 5 shows across slit CDU results for 65 nm dense lines before and after SERUM based REC. In Table 5, CDU H corresponds to the CDU of the horizontal lines and CDU V corresponds to the CDU of the vertical lines

TABLE 5

|           | Before REC | After REC |
|-----------|------------|-----------|
| CDU H     | 6.3        | 3.6       |
| CDU V     | 5.1        | 1.9       |
| CDU H&V   | 6.0        | 2.9       |
| HV bias   | 1.4        | −0.5      |

As shown in Table 5, the SERUM based REC leads to lower CDU across-slit and horizontal-vertical bias (HV bias).

Figure 16A:
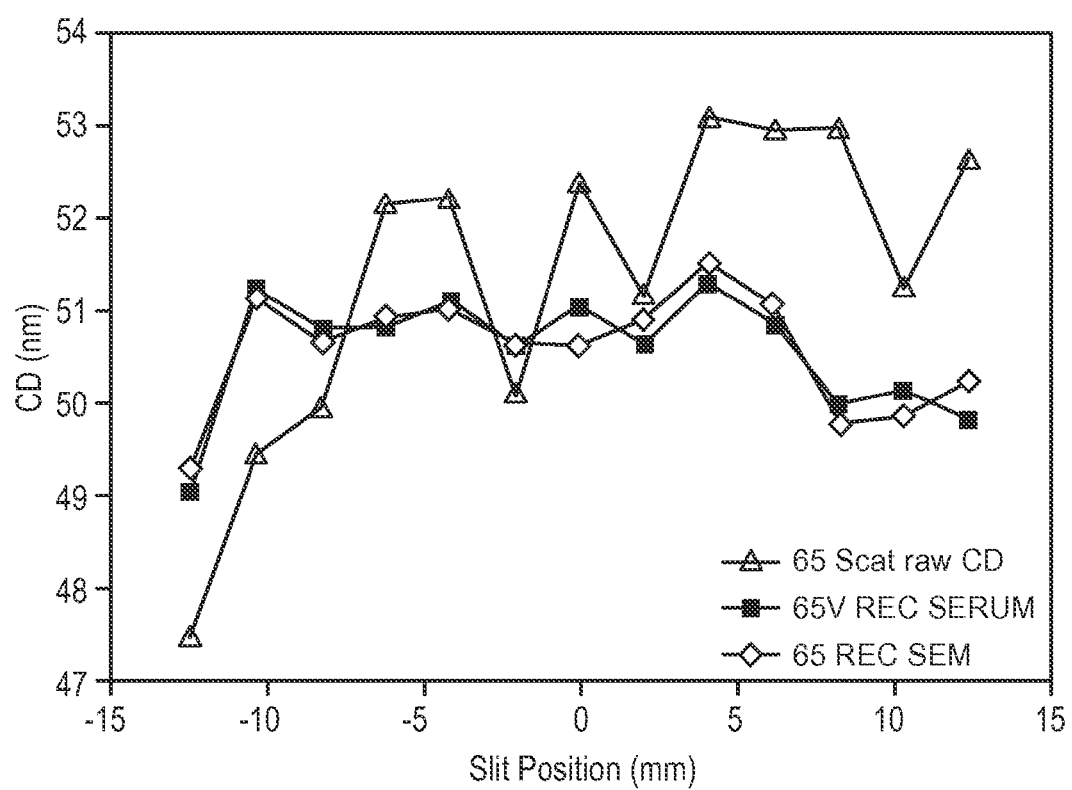
FIG. 16A shows an example of CDU across slit for 65 nm dense lines before and after REC based on both reticle SEM and SERUM.
Figure 16B:
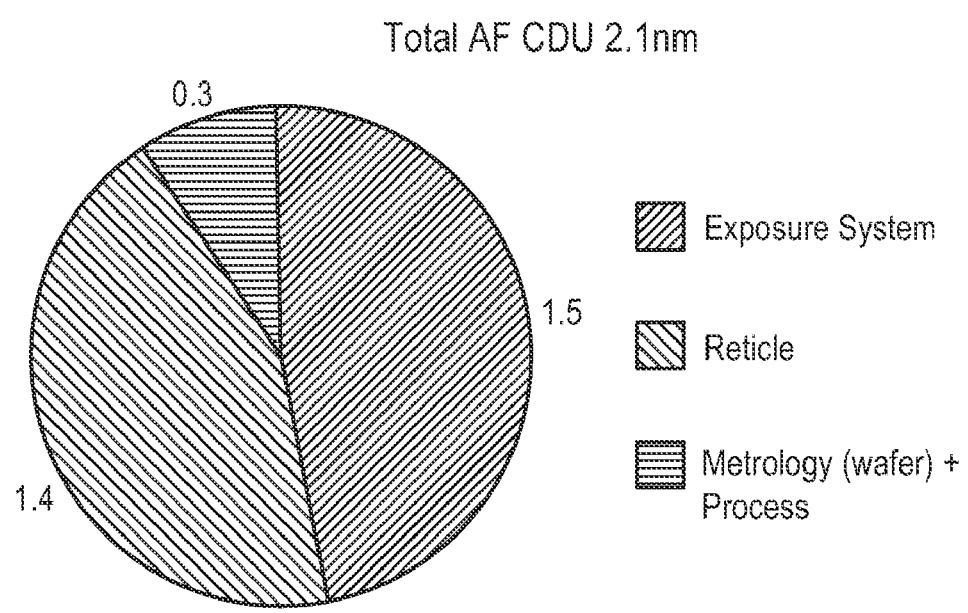
FIG. 16B shows across-field CD budget after REC and reticle CD metrology improvements.

FIG. 16A shows CDU across slit for 65 nm dense lines before and after REC based on both reticle SEM and SERUM. FIG. 16B shows across-field CD budget after REC and reticle CD metrology improvements. As expected from the good correlation of the reticle CD slit fingerprints of SEM and SERUM, the wafer CD slit fingerprint after REC is comparable. For both cases the CDU across-slit for the prototype system reduces from 5.1 nm (3σ) to 1.9 nm (3σ) after REC. FIG. 16B shows the 65 nm across-field CD budgets for dense lines using annular illumination after REC and reticle CD metrology improvements. As can be seen in FIG. 16B, the reticle residuals component no longer dominates the CDU system qualification test.

The method discussed herein provides CDU system qualification for 65 nm lines/spaces with scatterometry. The SERUM is a promising new technique for scatterometry reticle CD measurements offering fast analysis with excellent repeatability. The CDU predictive model was successfully employed for 65 nm CD budget analysis. With the improved measurement repeatability due to scatterometry and SERUM, the non-exposure tool CD contributors could be reduced to less than 30% of the entire across-field CD budget for 65 nm dense lines.

Since numerous modifications and changes will readily occur to those of skill in the art, it is not desired to limit the invention to the exact construction and operation described herein. For example, while the SERUM measurements are performed with certain parameters such as at certain radiation wavelength, with certain conditions of the projection system and/or with certain patterning devices, it must be appreciated that the SERUM measurements are not limited the these embodiments but can be performed with any selected parameters.

Moreover, the process, method and apparatus of the present invention, like related apparatus and processes used in the lithographic arts, tend to be complex in nature and are often best practiced by empirically determining the appropriate values of the operating parameters or by conducting computer simulations to arrive at a best design for a given applications and equivalents should be considered as falling within the spirit and scope of the invention.

What is claimed is:

1. A method for predicting a critical dimension of a feature imaged by a lithographic apparatus using a model, comprising:
    inputting at least one data parameter selected from the group consisting of a pupil measurement, a projection system aberration, a radiation dose profile, a focus profile, or any combination of the foregoing, into the model;
    inputting patterning device information data related to critical dimension metrology;
    inputting process information data related to critical dimension metrology; and
    converting the input data to substrate critical dimension uniformity data by using a plurality of simulated and/or measured data of Bossung curves, patterning device error factors, or both.

2. The method of claim 1, wherein the measured critical dimension data is obtained by using scatterometry.

3. The method of claim 2, wherein the measured critical dimension data obtained using scatterometry correlates with measured critical dimension data obtained using a scanning electron microscope.

4. The method of claim 1, wherein inputting patterning device information data includes inputting geometrical information of features of a pattern in the patterning device.

5. The method of claim 4, wherein the features include vertical lines, horizontal lines, or both.

6. The method of claim 4, wherein the features include holes.

7. The method of claim 1, further comprising performing a measurement with a scanning electron microscope to obtain the patterning device information data.

8. The method of claim 1, further comprising performing a measurement with a deep ultraviolet microscope to obtain the patterning device information data.

9. The method of claim 1, further comprising performing a spot sensor enabled patterning device measurement to obtain the patterning device information data.

10. The method of claim 9, wherein performing the spot sensor enabled patterning device measurement includes using a spot sensor provided in the lithographic apparatus to measure transmission of radiation through the patterning device.

11. The method of claim 9, wherein performing the spot sensor enabled patterning device measurement comprises performing a reference uniformity measurement through a clear area of the patterning device.

12. The method of claim 9, wherein performing the spot sensor enabled patterning device measurement comprises using a radiation beam in the lithographic apparatus.

13. The method of claim 9, wherein the radiation beam has a wavelength in the ultraviolet spectrum.

14. The method of claim 9, wherein the spot sensor enabled patterning device measurement is adjusted to take into account a position of the spot sensor relative to a grating region in the patterning device.

15. The method of claim 9, wherein the spot sensor enabled patterning device measurement is adjusted to take into account an area of the spot sensor relative to an area of a grating region in the patterning device.

16. The method of claim 9, wherein the patterning device is one of a binary mask and a phase shift mask.

17. The method of claim 9, further comprising applying a patterning device error correction to the spot sensor enabled patterning device measurement.

18. The method of claim 9, wherein the measurement is performed when a protective pellicle is mounted to the patterning device.

19. The method of claim 9, wherein the patterning device is a phase shift mask and the measurement is performed with actinic and non-actinic wavelengths.

20. The method of claim 19, wherein a phase of the phase shift mask is obtained from the measurement.

21. A lithographic apparatus, comprising:
    an illuminator configured to condition a beam of radiation;
    a support configured to hold a patterning device, the patterning device configured to pattern the beam according to a desired pattern;
    a substrate table configured to hold a substrate;
    a projection system configured to project the patterned beam onto a target portion of the substrate to form a patterned image on the substrate;
    a sensor configured and arranged to intercept a portion of the beam and to measure a transmission of the beam through at least a portion of the patterning device; and
    a calculator configured to convert a transmission measurement of the sensor into critical dimension data of the patterning device.

22. The apparatus of claim 21, wherein the sensor is a spot sensor disposed in the vicinity of the substrate table.

23. The apparatus of claim 21, wherein the sensor is configured to measure transmission through a clear area of the patterning device to establish a reference uniformity measurement.

24. The apparatus of claim 21, wherein the calculator is further configured to convert input data to substrate critical dimension uniformity data by using a plurality of simulated and/or measured data of Bossung curves, patterning device error factors or both.

25. The apparatus of claim 24, wherein the input data comprises a pupil measurement, a projection system aberration, a radiation dose profile, a focus profile, a process information data related to critical dimension metrology, or any combination of the foregoing.

26. The apparatus of claim 21, wherein the sensor is configured measure the transmission of the beam when a protective pellicle is mounted to the patterning device.

27. The apparatus of claim 21, wherein the patterning device is a phase shift mask and the sensor is configured measure the transmission of the beam with actinic and non-actinic wavelengths.

28. A method for predicting a critical dimension of a feature imaged by a lithographic apparatus using a model, comprising:
    inputting at least one data parameter selected from the group consisting of a pupil measurement, a projection system aberration, a radiation dose profile, a focus profile, or any combination of the foregoing into the model;
    performing a spot sensor enabled patterning device measurement to obtain a patterning device information data related to critical dimension;
    inputting the patterning device information data into the model;
    inputting process information data related to critical dimension metrology into the model; and
    converting the input data to substrate critical dimension uniformity data by using a plurality of simulated and/or measured data of at least one of Bossung curves and patterning device error factors.

29. The method of claim 28, wherein performing a spot sensor enabled patterning device measurement includes using a spot sensor provided in the lithographic apparatus to measure transmission of radiation through the patterning device.

30. The method of claim 29, wherein the radiation has a wavelength in the ultraviolet spectrum.

31. The method of claim 28, wherein the spot sensor enabled patterning device measurement is adjusted to take into account a position of the spot sensor relative to a grating region in the patterning device.

32. The method of claim 28, wherein the spot sensor enabled patterning device measurement is adjusted to take into account an area of the spot sensor relative to an area of a grating region in the patterning device.

33. The method of claim 28, further comprising applying a patterning device error correction to the spot sensor enabled patterning device measurement.

34. The method of claim 1, wherein the information data related to critical dimension metrology comprise information about the type and characteristics of the metrology tool that is being used to perform metrology measurements.

35. The method of claim 1, wherein information data related to critical dimension metrology are representative of a contribution to critical dimension errors of a metrology tool that is used to perform critical dimension measurements.

* * * * *